(12) United States Patent
Umemura et al.

(10) Patent No.: US 7,081,758 B2
(45) Date of Patent: Jul. 25, 2006

(54) INSPECTION PATTERN, INSPECTION METHOD, AND INSPECTION SYSTEM FOR DETECTION OF LATENT DEFECT OF MULTI-LAYER WIRING STRUCTURE

(75) Inventors: Eiichi Umemura, Tokyo (JP); Hiroyuki Fukunaga, Tokyo (JP); Hiroyuki Nakayashiki, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/037,131

(22) Filed: Jan. 19, 2005

(65) Prior Publication Data

US 2005/0199875 A1  Sep. 15, 2005

Related U.S. Application Data

(62) Division of application No. 10/216,447, filed on Aug. 12, 2002, now Pat. No. 6,884,637.

(30) Foreign Application Priority Data

Aug. 14, 2001 (JP) ............................. 2001-245935
Jul. 8, 2002 (JP) ............................. 2002-198360

(51) Int. Cl.
*G01R 31/02* (2006.01)
*H01L 23/58* (2006.01)

(52) U.S. Cl. ................. 324/537; 257/48; 257/E21.521; 438/14

(58) Field of Classification Search ............... 257/48, 257/E21.521; 324/537; 438/14
See application file for complete search history.

(56) References Cited

U.S. PATENT DOCUMENTS

| | | | | |
|---|---|---|---|---|
| 5,049,811 A | * | 9/1991 | Dreyer et al. | 324/537 |
| 5,514,974 A | * | 5/1996 | Bouldin | 324/763 |
| 5,712,510 A | * | 1/1998 | Bui et al. | 257/758 |
| 5,900,735 A | | 5/1999 | Yamamoto | |
| 6,054,721 A | * | 4/2000 | Milor | 257/48 |
| 6,825,671 B1 | * | 11/2004 | Zhang | 324/525 |
| 6,842,028 B1 | * | 1/2005 | Song et al. | 324/763 |

FOREIGN PATENT DOCUMENTS

| | | |
|---|---|---|
| JP | 10-135297 | 5/1998 |
| JP | 10-135298 | 5/1998 |
| JP | 10-341079 | 12/1998 |
| JP | 2000-232144 A | 8/2000 |

* cited by examiner

*Primary Examiner*—Kenneth Parker
*Assistant Examiner*—José R. Díaz
(74) *Attorney, Agent, or Firm*—VolentineFrancos&Whitt PLLC

(57) ABSTRACT

An inspection pattern, an inspection method, and an inspection system for detection of a latent defect of a multi-layer wiring structure formed on the semiconductor wafer. The inspection pattern includes lower-layer wiring portions, upper-layer wiring portions, an insulating layer provided between them, contact units connecting them to form a contact chain, and electrode terminals. The inspection method includes the steps of acquiring an applied-voltage versus measured-current characteristic or an elapsed-time versus measured-voltage characteristic of the inspection pattern, and judging presence or absence of a latent defect of the inspection pattern on the basis of the acquired characteristic. The inspection system includes a voltage-applying/current-measuring device or a constant-current-feeding/voltage-measuring device, and a judging device for judging presence or absence of a latent defect of the inspection pattern.

20 Claims, 20 Drawing Sheets

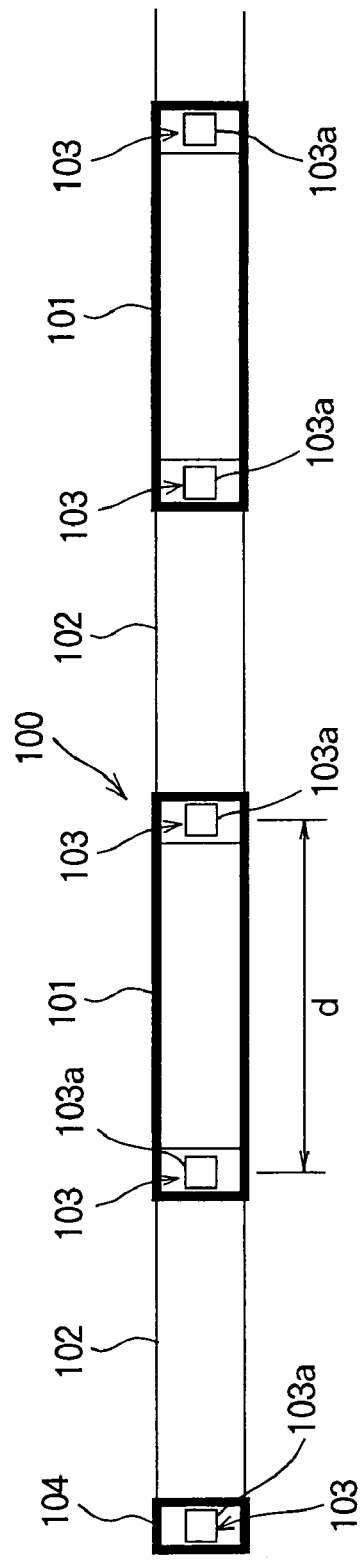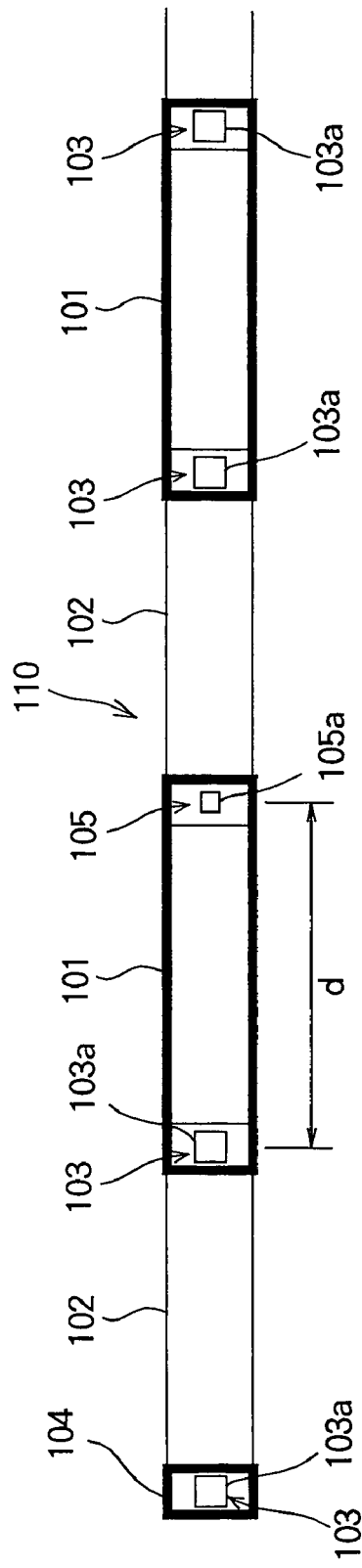

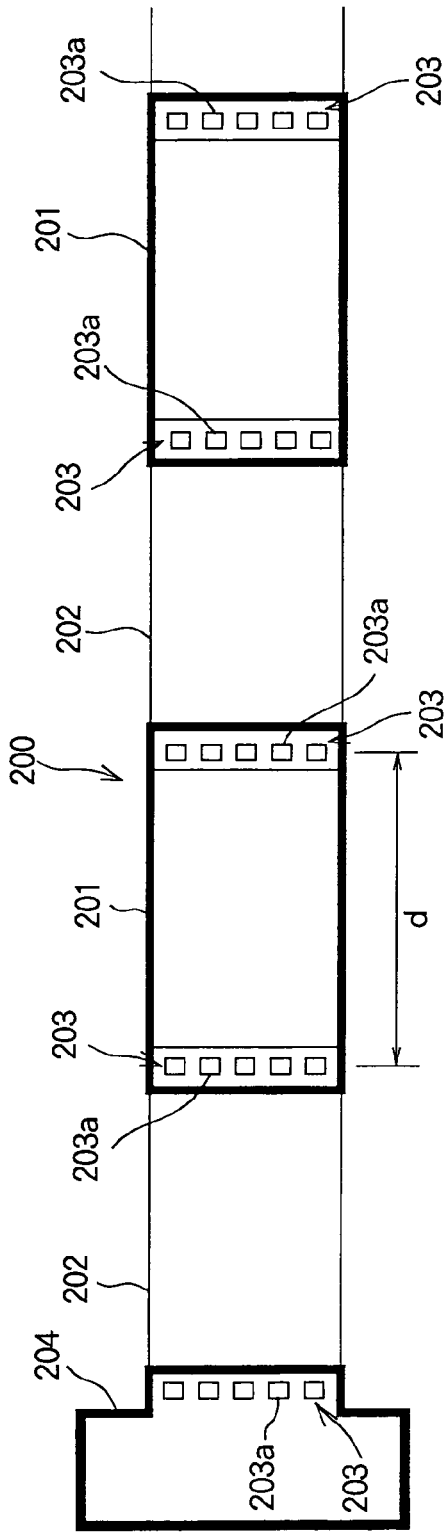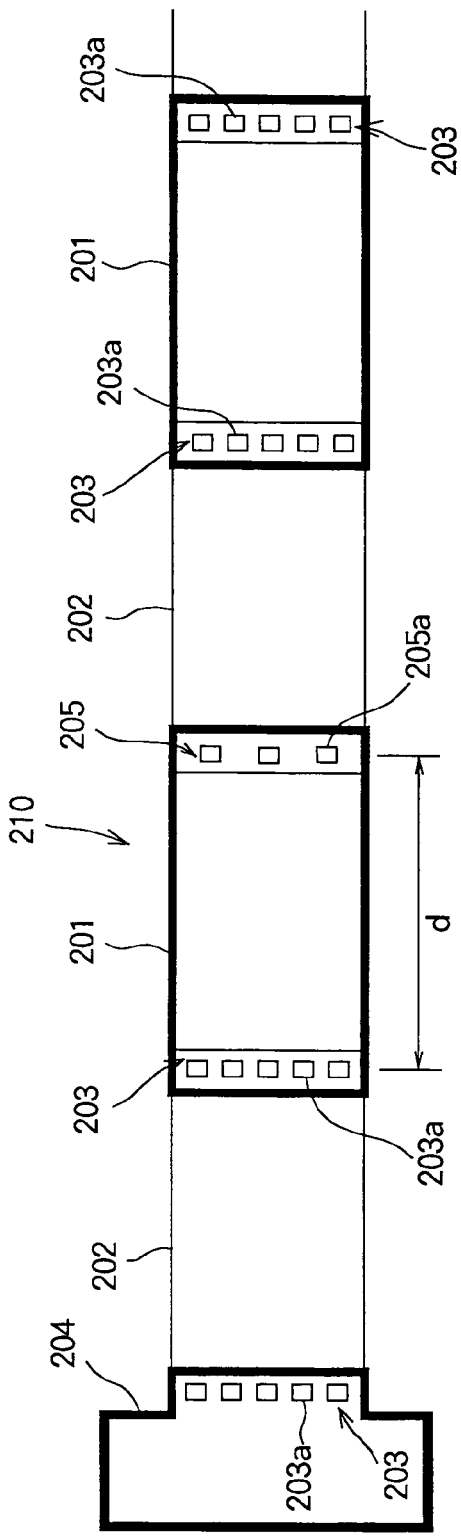

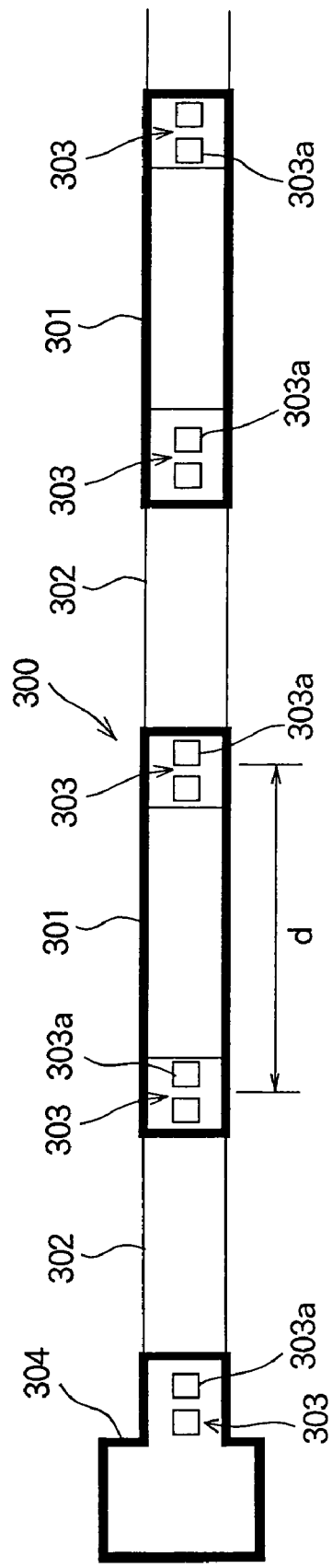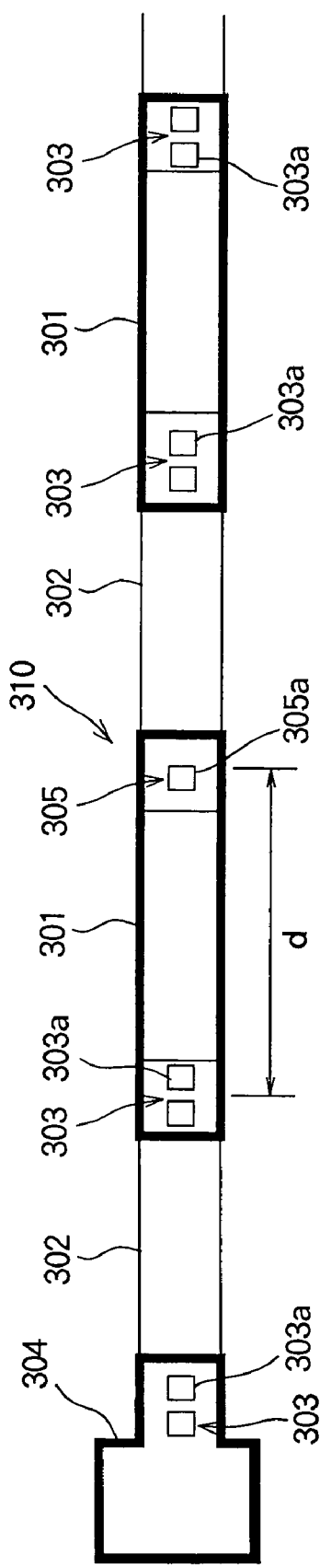

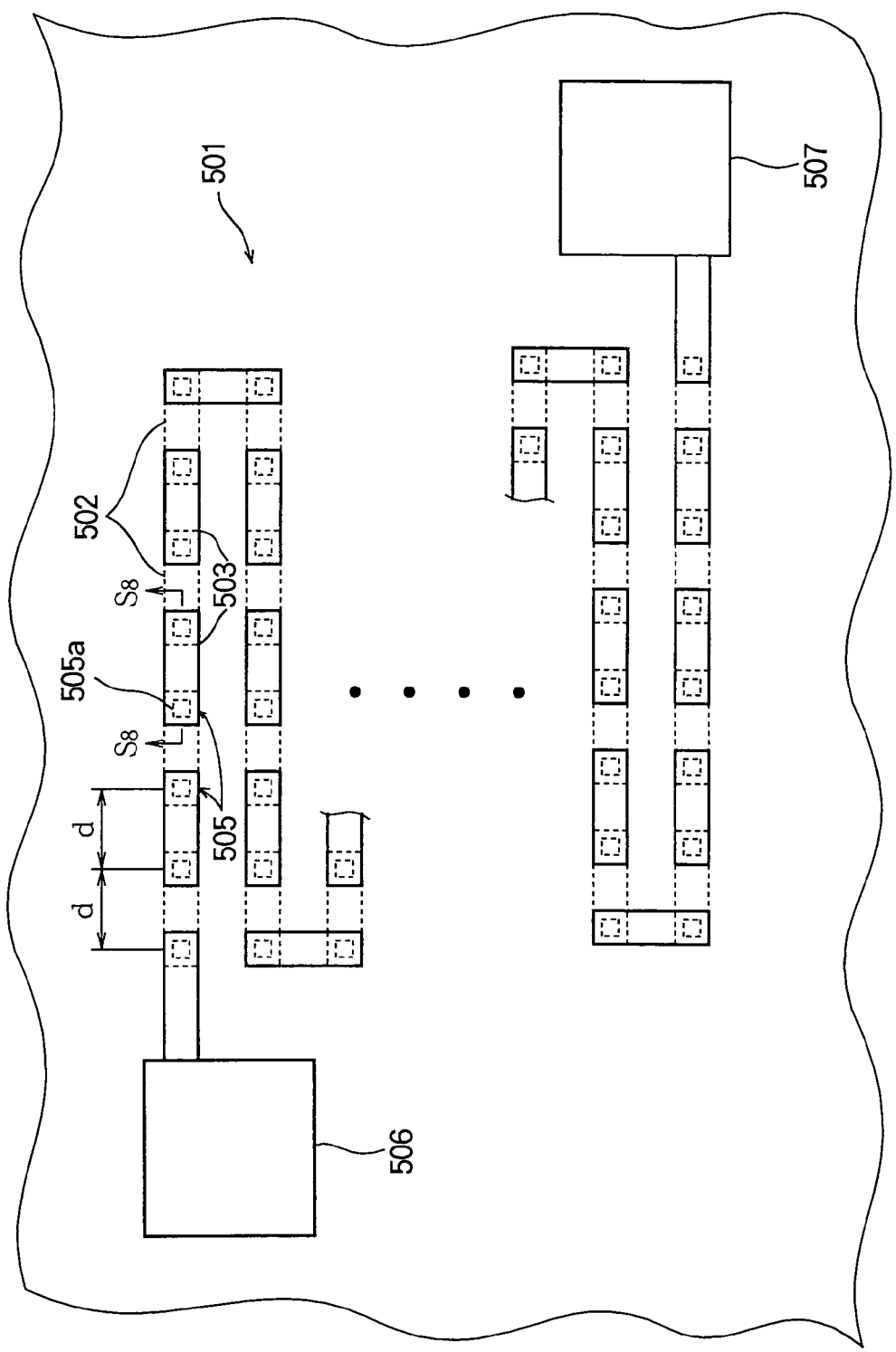

INSPECTION PATTERN, INSPECTION METHOD, AND INSPECTION SYSTEM FOR DETECTION OF LATENT DEFECT OF MULTI-LAYER WIRING STRUCTURE

CROSS-REFERENCE TO RELATED APPLICATIONS

This is a divisional of application Ser. No. 10/216,447, filed Aug. 12, 2002, U.S. Pat. No. 6,884,637, which is incorporated herein by reference in its entirety.

BACKGROUND OF THE INVENTION

The present invention relates to an inspection pattern formed on a semiconductor wafer for detection of a latent defect of a multi-layer wiring structure of a semiconductor device (that is, for quality inspection of a metal process of a semiconductor device). The present invention also relates to a semiconductor device including the aforementioned inspection pattern, an inspection method of a semiconductor device using the aforementioned inspection pattern, and an inspection system that implements the aforementioned inspection method.

FIG. 28 is a schematic vertical cross-sectional view showing a multi-layer wiring structure of a semiconductor device. In the multi-layer wiring structure of FIG. 28, a contact hole (which is also referred to as a "via-hole" or a "through-hole") 13 filled with a metal (e.g., a tungsten (W) plug) 14 is provided in an insulating layer 19 between the upper-layer wiring portion 11 and the lower-layer wiring portion 12 that are made of aluminum (Al), for example. The contact hole 13 establishes an electrical connection between the upper-layer wiring portion 11 and the lower-layer wiring portion 12. In the following description, the contact hole 13 filled with a metal is referred to as a "contact portion" or a "via". A multi-layer wiring structure including a plurality of upper-layer wiring portions, a plurality of lower-layer wiring portions, and a plurality of contact portions electrically connecting the upper-layer wiring portions and the lower-layer wiring portions alternately in series is referred to as a "contact chain" (which is also referred to as a "via-hole chain" or a "through-hole chain").

In the forming process of the tungsten plug 14, an adhesion layer made of a high melting point metal such as sputtered titanium nitride (TiN) is formed on the lower-layer wiring portion 12. For the purpose of removing an oxide 15 formed at the bottom of the contact hole 13 (i.e., on the lower-layer wiring portion 12), prior to the formation of the TiN adhesion layer, the lower-layer wiring portion 12 is generally subjected to the cleaning sputtering process. However, there occurs a case where a process abnormality makes it impossible to remove the oxide or causes the oxide to partly remain in the contact portion.

When the oxide cannot be removed at all, the resistance of each contact portion (including its connection parts) will increase extremely or each contact portion will fail to be conducted. Thus through a continuity test or the like for the contact portion, a remarkable defect or failure resulting from a process abnormality can be detected. Further, when the oxide partly remains at all the contact portions in the contact chain, the entire resistance of the contact chain will increase. Thus a defect or failure resulting from a process abnormality can be detected by measuring the resistance of the entire contact chain.

However, when the oxide partly remains only in any one or some of the plurality of contact portions in the contact chain, it is difficult to detect a defect by a continuity test of the contact portion or by measuring the resistance of the entire contact chain. This is because an increase in the resistance or resistances of one or some contact portions alone is very small when compared with the resistance of the entire contact chain and is indistinguishable from fluctuations of the resistance of the entire contact chain.

As described above, there may be cases where a process abnormality causes the increase of the resistance or resistances only in random one or some parts of the contact chain, which is very small when compared with the resistance of the entire contact chain. The defects resulting from such process abnormality include a defect in an interface 15 between the tungsten plug 14 and the lower-layer wiring portion 12, a void (or a cavity) 16 in the tungsten plug 14, a defect in an interface 17 between the tungsten plug 14 and the upper-layer wiring portion 11, a defect 18 existing in the wiring portion 11 or 12, and a degraded metal coverage (i.e., a coverage defect) The defects may possibly be generated in any position within the contact chain.

SUMMARY OF THE INVENTION

It is an object of the present invention to provide an inspection pattern that enables to easily detect in a short time a latent defect of a multi-layer wiring structure formed in a semiconductor device, thereby increasing reliability of semiconductor products put on the marketplace, a semiconductor device including the inspection pattern, an inspection method of the semiconductor device using the inspection pattern, and an inspection system that implements the inspection method.

According to one aspect of the present invention, an inspection pattern formed on a semiconductor wafer for detection of a latent defect of a multi-layer wiring structure formed on the semiconductor wafer, includes: a plurality of lower-layer wiring portions arranged so as to be spaced at a distance; a plurality of upper-layer wiring portions arranged so as to be spaced at a distance; an insulating layer provided between the plurality of lower-layer wiring portions and the plurality of upper-layer wiring portions; a plurality of contact units which electrically connects the plurality of lower-layer wiring portions and the plurality of upper-layer wiring portions so as to form a contact chain including the plurality of lower-layer wiring portions and the plurality of upper-layer wiring portions alternately connected in series; and a pair of electrode terminals, one of the electrode terminals being electrically connected to one end of the contact chain, the other of the electrode terminals being electrically connected to the other end of the contact chain. A length of each of the plurality of lower-layer wiring portions, a length of each of the plurality of upper-layer wiring portions, and a position of each of the plurality of contact units are set in such a way that an interval between ones of the plurality of contact units adjacent to each other in a longitudinal direction of the lower-layer wiring portion or the upper-layer wiring portion is no longer than 50 µm.

According to another aspect of the present invention, a semiconductor device including a multi-layer wiring structure, and the aforementioned inspection pattern.

According to a further aspect of the present invention, an inspection method of a semiconductor device, includes acquiring an applied-voltage versus measured-current characteristic of the inspection pattern by applying a voltage to between the pair of electrode terminals and measuring a current flowing through the contact chain for a plurality of applied-voltages having different values, and judging presence or absence of a latent defect of the inspection pattern on the basis of the applied-voltage versus measured-current characteristic of the inspection pattern.

wherein the semiconductor device includes a multi-layer wiring structure, and an inspection pattern for detection of a latent defect of the multi-layer wiring structure. In this case, the inspection pattern includes: a plurality of lower-layer wiring portions arranged so as to be spaced at a distance; a plurality of upper-layer wiring portions arranged so as to be spaced at a distance; an insulating layer provided between the plurality of lower-layer wiring portions and the plurality of upper-layer wiring portions; a plurality of contact units which electrically connects the plurality of lower-layer wiring portions and the plurality of upper-layer wiring portions so as to form a contact chain including the plurality of lower-layer wiring portions and the plurality of upper-layer wiring portions alternately connected in series; and a pair of electrode terminals, one of the electrode terminals being electrically connected to one end of the contact chain, the other of the electrode terminals being electrically connected to the other end of the contact chain.

According to a further aspect of the present invention, an inspection method of a semiconductor device, includes acquiring an elapsed-time versus measured-voltage characteristic of the inspection pattern by passing a predetermined current through between the pair of electrode terminals of the inspection pattern and measuring a time change in a voltage developed between the pair of electrode terminals, and judging presence or absence of a latent defect of the inspection pattern on the basis of the elapsed-time versus measured-voltage characteristic of the inspection pattern. In this case, the inspection pattern includes: a plurality of lower-layer wiring portions arranged so as to be spaced at a distance; a plurality of upper-layer wiring portions arranged so as to be spaced at a distance; an insulating layer provided between the plurality of lower-layer wiring portions and the plurality of upper-layer wiring portions; a plurality of contact units which electrically connects the plurality of lower-layer wiring portions and the plurality of upper-layer wiring portions so as to form a contact chain including the plurality of lower-layer wiring portions and the plurality of upper-layer wiring portions alternately connected in series; and a pair of electrode terminals, one of the electrode terminals being electrically connected to one end of the contact chain, the other of the electrode terminals being electrically connected to the other end of the contact chain.

According to a further aspect of the present invention, an inspection system for a semiconductor device, includes a voltage-applying/current-measuring device which acquires an applied-voltage versus measured-current characteristic of the inspection pattern by applying a voltage to between the pair of electrode terminals and measuring a current flowing through the contact chain for a plurality of applied-voltages having different values, and a judging device which judges presence or absence of a latent defect of the inspection pattern on the basis of the applied-voltage versus measured-current characteristic of the inspection pattern.

According to a further aspect of the present invention, an inspection system for a semiconductor device, includes a constant-current-feeding/voltage-measuring device which acquires an elapsed-time versus measured-voltage characteristic of the inspection pattern by passing a predetermined current through between the pair of electrode terminals of the inspection pattern and measuring a time change in a voltage developed between the pair of electrode terminals; and a judging device which judges presence or absence of a latent defect of the inspection pattern on the basis of the elapsed-time versus measured-voltage characteristic of the inspection pattern.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 1A and 1B are a schematic plan view showing an inspection pattern in accordance with a first embodiment of the present invention and a schematic plan view showing an auxiliary pattern in accordance with the first embodiment, respectively;

FIGS. 2A and 2B are a schematic plan view showing an inspection pattern in accordance with a second embodiment of the present invention and a schematic plan view showing an auxiliary pattern in accordance with the second embodiment, respectively;

FIGS. 3A and 3B are a schematic plan view showing an inspection pattern in accordance with a third embodiment of the present invention and a schematic plan view showing an auxiliary pattern in accordance with the third embodiment, respectively;

FIG. 7 is a schematic plan view, with certain part omitted, showing an inspection pattern used in an inspection method in accordance with a fifth embodiment of the present invention;

DETAILED DESCRIPTION OF THE INVENTION

Figure 4A:
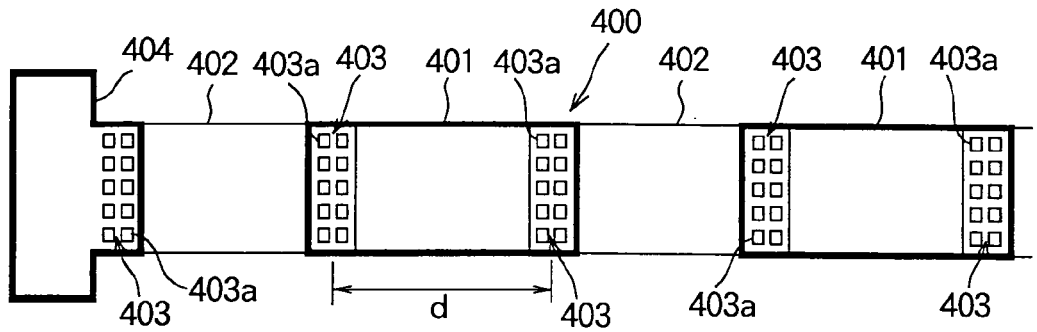
FIG. 4A is a schematic plan view showing an inspection pattern in accordance with a fourth embodiment of the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

DESCRIPTION COMMON TO FIRST THROUGH FOURTH EMBODIMENTS

<Configurations of Inspection Pattern and Auxiliary Pattern>

The inspection patterns in accordance with the first through fourth embodiments of the present invention includes contact chains of different shape respectively. Each contact chain includes a plurality of multi-layer wiring portions and a plurality of contact units that electrically connect the multi-layer wiring portions, which include upper-layer wiring portions and lower-layer wiring portions. In the first through fourth embodiments, an interval between the contact units adjacent to each other is set so as to develop the backflow effect in the wiring portions, thereby suppressing the electromigration effect in the wiring portions. Such interval between the contact units adjacent to each other in the inspection patterns in accordance with the first through fourth embodiments is no longer than 50 μm. The inspection patterns in the first through fourth embodiments is used only for detection of a defect or failure in the multi-layer wiring structure of a semiconductor device (that is, for quality inspection of a metal process as a manufacturing process of the multi-layer wiring structure of the semiconductor device) and do not function as a circuit of a semiconductor element (i.e., a semiconductor product to be put on the marketplace).

In general, all contact units in each of the inspection patterns in accordance with the first through fourth embodiments have the same or substantially same structure. In the description of the first through fourth embodiments, the contact unit of the inspection pattern is referred to as a "standard contact unit."

The auxiliary patterns in accordance with the first through fourth embodiments are similar to the inspection patterns in accordance with the first through fourth embodiments respectively. In each auxiliary pattern, at least one of the contact units has a structure different from that of the standard contact unit, and the remaining contact units have the same structure as that of the standard contact unit. In the description of the first through fourth embodiments, the contact unit having a structure different from that of the standard contact unit is referred to as a "false-abnormal contact unit" or a "nonstandard contact unit." There is a plurality kind of auxiliary patterns each having a false-abnormal contact unit or units and each having different structures.

The contact unit electrically connects one end of an upper-layer wiring portion with one end of a lower-layer wiring portion. The contact unit, which is also referred to as a "via unit", includes one or more contact portions. The contact portion, which is also referred to as a "via", is formed by filling one or more contact holes with a metal or metals.

Through a wiring process in a wafer process, the inspection patterns and auxiliary patterns in accordance with the first through fourth embodiments are formed on or around a grid line (i.e., a scribe line) of the semiconductor wafer, in TEG (test element group) regions within the chip areas on the semiconductor wafer, or the like.

Pattern units are formed on the semiconductor wafer. Each pattern unit may include (i) an inspection pattern or patterns, (ii) an auxiliary pattern or patterns, (iii) a plurality of auxiliary patterns each having the false-abnormal contact units having mutually different structures, (iv) a combination of an inspection pattern or patterns and an auxiliary pattern or patterns, or (v) a combination of an inspection pattern or patterns and a plurality of auxiliary patterns each having the false-abnormal contact units having mutually different structures.

In a manufacturing process of the semiconductor device, since a photolithography process is generally executed using the step-and-repeat exposure, the pattern units can be formed so as to correspond to the respective chips (i.e., the pattern units are formed in the vicinity of the respective chip areas on the semiconductor wafer or in the respective TEG regions on the semiconductor wafer).

Figure 5:
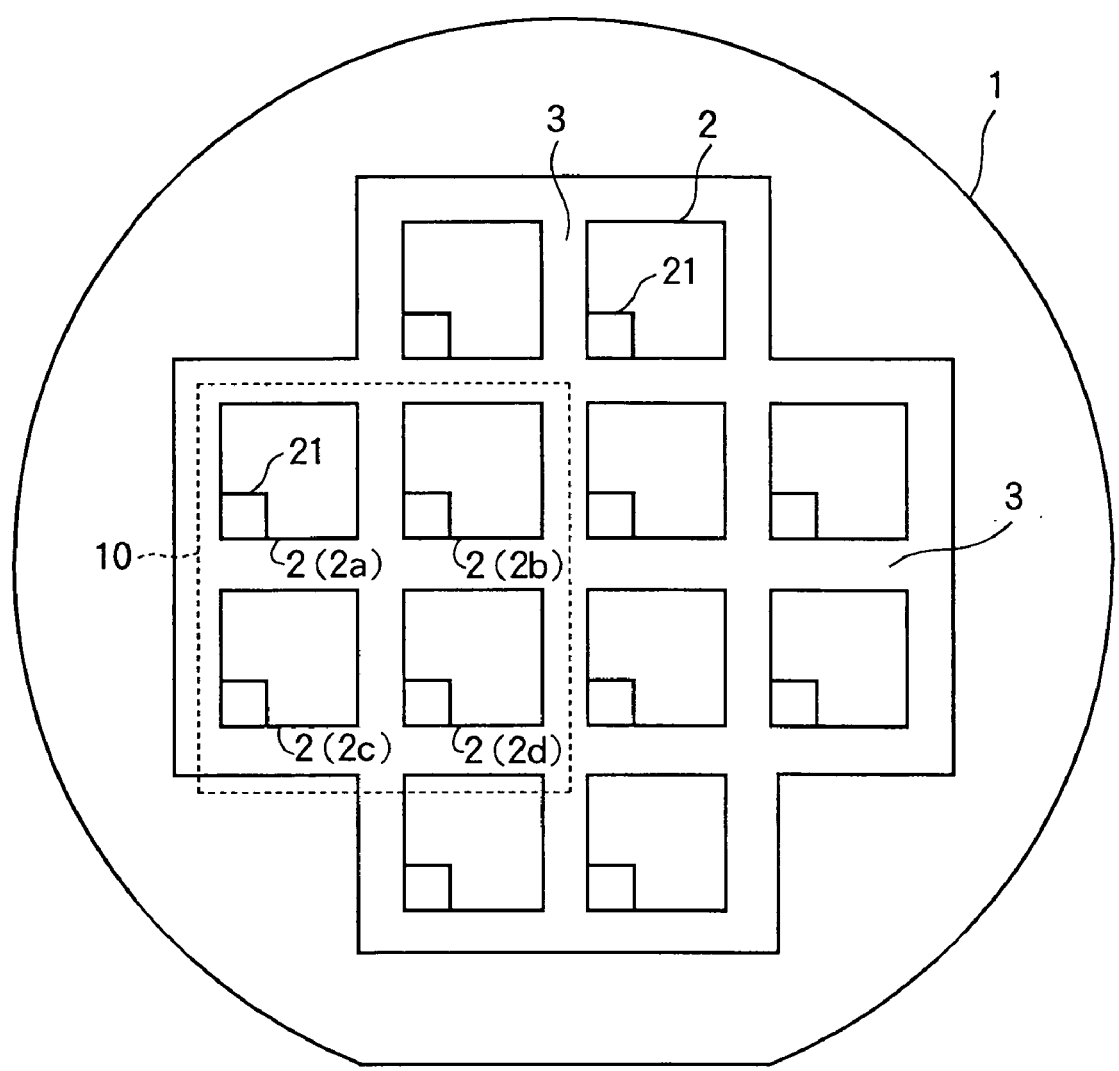
FIG. 5 is a schematic plan view showing an arrangement of chip areas and grid lines in a semiconductor wafer.

FIG. 5 is a schematic plan view showing an arrangement of grid lines and chip areas in a semiconductor wafer. In FIG. 5, a reference numeral 1 denotes a semiconductor wafer, 2 denotes a chip area, 21 denotes a TEG region, and 3 denotes a grid line (a scribe line). In FIG. 5, twelve chip areas 2 including chip areas 2a, 2b, 2c and 2d are provided on the semiconductor wafer 1 of FIG. 5. A circuit of a semiconductor element is formed in the chip area 2. The TEG regions 21 are provided within the chip areas 2 respectively. Various TEGs are formed in the TEG regions 21 respectively. The grid lines 3 are disposed between the adjacent chip areas 2. After the wafer process is completed, the semiconductor wafer 1 is scribed along the grid lines 3 and the chip areas 2 are separated to be individual chips.

Figure 6A:
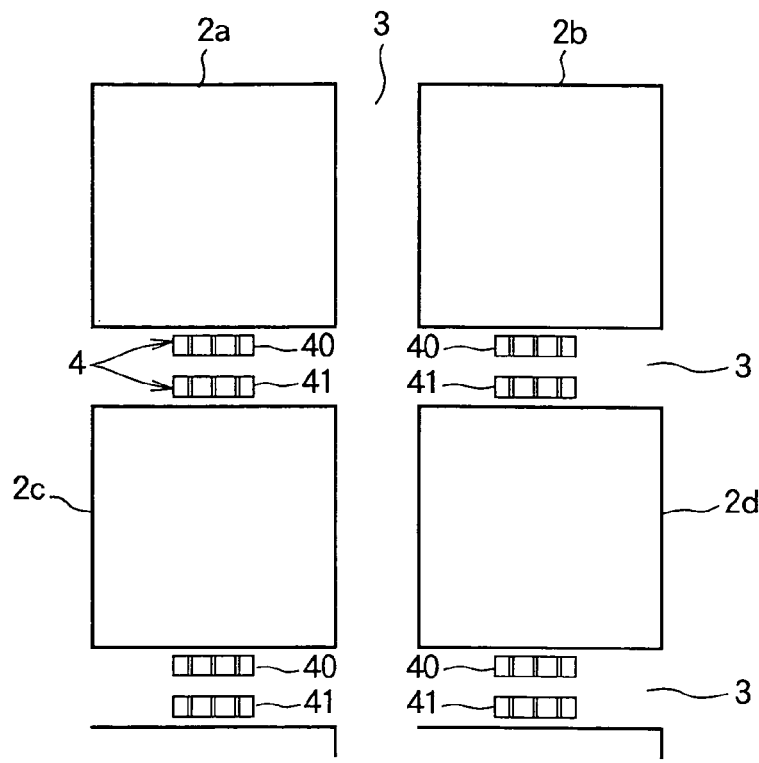
FIGS. 6A and 6B are schematic plan views showing an arrangement of the inspection patterns and auxiliary patterns in accordance with the embodiment shown in FIG. 5.
Figure 6B:
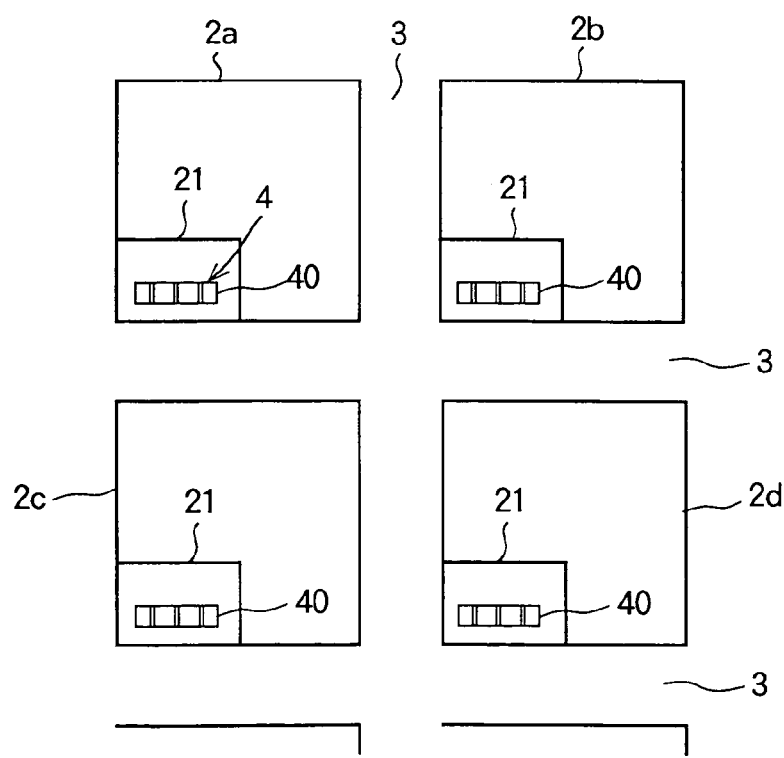

FIGS. 6A and 6B are schematic plan views showing an arrangement of the inspection patterns and auxiliary patterns on a semiconductor wafer in accordance with the embodiment shown in FIG. 5. More specifically, FIGS. 6A and 6B are enlarged plan views showing a part 10 of FIG. 5. In FIGS. 6A and 6B, the same parts as those in FIG. 5 are denoted by the same reference numerals or symbols. In FIGS. 6A and 6B, a reference numeral 4 denotes a pattern unit formed on the semiconductor wafer 1. Further, in FIGS. 6A and 6B, a reference numeral 40 denotes an inspection pattern, and 41 denotes an auxiliary pattern. In FIG. 6A, the pattern units 4 each includes the inspection pattern 40 and the auxiliary pattern 41 and are formed on or around the grid lines 3 or in the TEG regions. As another example, the pattern units 4 each includes only the inspection pattern 40 or each includes the inspection pattern 40 and a plurality of auxiliary patterns 41. These types of pattern units also may be formed on or around the grid lines 3 or in the TEG regions. In FIG. 6B, the pattern units 4 each includes only the inspection pattern 40 and are formed in the TEG regions 21 of the chip areas 2. In a defect detection test (i.e., an inspection method), there are two cases of using only the inspection pattern 40 and using both of the inspection and auxiliary patterns 40 and 41.

<Defect Detection Principle Using Inspection Pattern>

An explanation will be made as to the defect detection principle using the inspection patterns of the first through fourth embodiments. The explanation will first be made in connection with an inspection pattern which includes a plurality of upper-layer wiring portions, a plurality of lower-layer wiring portions, and a plurality of standard contact units having the same structure. When the inspection pattern is formed through the normal manufacturing process, the resistances of the contact units have a distribution determined by conditional fluctuations in the normal manufacturing process. In general, the highest-resistance part in the inspection pattern exists in any of the standard contact units. Assume that each contact units have an average resistance value $r_0$ and one of the contact units have the highest resistance value $r_{max}$. In this connection, the term "part" in "highest-resistance part" means a part of the inspection pattern (or contact chain) such as a part of the wiring portion or a part of the contact unit (including a junction part to the wiring portion).

When a current is made to flow between the electrode terminals (pad electrodes) connected to both ends of the contact chain in the inspection pattern formed through the normal manufacturing process, the Joule heat is generated at the respective parts of the contact chain in the inspection pattern, one of the standard contact units having the highest resistance value generates the greatest heat and thus suffers the soonest deterioration (e.g., resistance increase or fused wire) The standard contact unit having the highest resistance value is present randomly in the inspection pattern. The aforementioned current is, for example, (i) a constant current, (ii) a current linearly increased (i.e., linearly increasing current), (iii) a current increased stepwise (i.e., stepwise increasing current), or (iv) a current based on a constant voltage, a voltage linearly increased (i.e., linearly increasing voltage), or a voltage stepwise increased (i.e., stepwise increasing voltage). The aforementioned deterioration, which depends on the amount of the Joule heat (which is proportional to the square of the current value), is accelerated as the applied current value increases.

The durability performance of the inspection pattern is inspected by causing the current to flow the inspection pattern until the deterioration occurs. The durability performance depends on the resistance value of the highest-resistance part, that is, on the resistance value $r_{max}$ of the part in the standard contact unit. The durability performance can be expressed, for example, by power consumption until occurrence of the deterioration, by a current application time until occurrence of the deterioration, or the like.

Next, assume that a process abnormality occurs during the manufacturing process of the inspection pattern and the resistance value of any of the standard contact units thereof is increased from $r_0$ to $(k \times r_0)$, where $k>1$ and $k \times r_0 > r_{max}$. When a current under the same conditions as those used for the inspection pattern formed through the normal manufacturing process is made to flow between the electrode terminals provided at both ends of the contact chain in the inspection pattern, which includes a standard contact unit having an increased resistance value, the Joule heat is most greatly generated in the standard contact unit having a resistance value increased to $(k \times r_0)$. This standard contact unit will be most fast (i.e., in the shortest time) degraded. The durability performance of the inspection pattern formed through the abnormal manufacturing process depends on the resistance value of the highest-resistance part, that is, on the resistance value $(k \times r_0)$ of the standard contact unit having the resistance value increased.

The resistance value $(k \times r_0)$ of the highest-resistance part in the inspection pattern formed through the abnormal manufacturing process is larger than the resistance value $r_0$ of the highest-resistance part in the inspection pattern formed through the normal manufacturing process. Thus the heat generation amount of the highest-resistance part in the inspection pattern formed through the abnormal manufacturing process is larger than that of the highest-resistance part in the inspection pattern formed through the normal manufacturing process. Therefore, the durability performance of the inspection pattern formed through the abnormal manufacturing process becomes lower than that of the inspection pattern formed through the normal manufacturing process. For example, the inspection pattern formed through the abnormal manufacturing process is degraded (e.g., the wiring is fused and broken) with less power consumption or in a current application time shorter than the inspection pattern formed through the normal manufacturing process.

From the above fact, it can be estimated that an abnormality or defect, which is similar to an abnormality or defect produced in the inspection pattern through the abnormal manufacturing process, must be produced even in a semiconductor product having a multi-layer wiring structure (contact chain) in the chip area 2 on the semiconductor wafer 1. For this reason, by evaluating the durability performance of the inspection pattern, a defect resulting from such a process abnormality as to increase the resistance value of only any part of the contact chain in the chip area 2 can be detected. In this connection, even when the highest-resistance part of the inspection pattern exists in the wiring portions, a defect can be similarly detected.

In this case, a problem is that, when the aforementioned current is made to flow so that resistance increase caused by the electromigration takes place in the wiring portions of the inspection pattern, the resistance value of the abnormal part of the inspection pattern cannot be measured accurately and thus the accurate defect detection cannot be realized.

To resolve this problem, in the inspection patterns in accordance with the first through fourth embodiments, the interval between the contact units adjacent to each other is set at no longer than 50 μm. Therefore, even when the current is made to flow, the resistance increase caused by the electromigration can be suppressed by the backflow effect in the wiring portions. As a result, even when the current is made to flow, the respective resistance values of each abnormal part of the inspection pattern can be accurately measured and thus the accurate defect detection can be realized.

<Preparation for Inspection Using Inspection Pattern>

In general, when a defect detection test is conducted to detect a defect resulting from the abnormal manufacturing process, a defect detection sensitivity (a detectable resistance increase or whether or not to detect a resistance increase caused by the process abnormality) is measured. In other words, in the defect detection test, a detection sensitivity characteristic (reduction of the durability performance) or the like is measured. Preparation for setting conditions of a current to be fed through the inspection pattern in the defect detection test, and preparation for setting an estimation criterion (judgement criterion of whether to judge normal or not) in the defect detection test is made. In this connection, there is a problem that such process control is difficult as to form the resistance increase part only in a desired part in the inspection pattern. For example, such process control as to form a part increased in resistance in all the standard contact units of the inspection pattern is possible, but such process control as to form the resistance increased part only in any of the standard contact units of the inspection pattern is difficult.

To avoid this, in the preparation for the defect detection test, the auxiliary pattern is used in addition to the inspection pattern. In the auxiliary pattern and inspection pattern formed through the normal manufacturing process, the resistance of the contact portion of the false-abnormal contact unit is larger than that of the contact portion of the standard contact unit. In other words, the highest-resistance part in the inspection pattern formed through the normal manufacturing process is any of the standard contact units, whereas, the highest-resistance part in the auxiliary pattern formed through the normal manufacturing process is the false-abnormal contact unit. Further, the resistance value of the false-abnormal contact unit is larger than the resistance value of the standard contact unit of the auxiliary pattern and inspection pattern formed through the normal manufacturing process. The false-abnormal contact unit of the auxiliary pattern corresponds to a simulation of a standard contact unit that has an increased resistance part resulting from the process abnormality. The false-abnormal contact unit having the resistance ($k \times r_0$) formed through the normal manufacturing process corresponds to a simulation of the standard contact unit that has an increased resistance ($k \times r_0$) resulting from the process abnormality.

In the defect detection test, when a current is made to flow through the inspection pattern and auxiliary pattern formed through the normal manufacturing process under the same conditions, any of the standard contact units is degraded and a location of the degraded part is random in the inspection pattern. In the auxiliary pattern, on the other hand, since the largest heat generation takes place in the false-abnormal contact unit, the false-abnormal contact unit is degraded.

In the defect detection test, when a current is made to flow through an inspection pattern including a plurality of standard contact units having a resistance value $r_0$ and through an auxiliary pattern including a plurality of standard contact units and a single false-abnormal contact unit having the resistance value ($k \times r_0$) under the same conditions, if the durability performance until the occurrence of the deterioration of the auxiliary pattern is clearly lower than the durability performance until the occurrence of the deterioration of the inspection pattern, then such a process abnormality as to increase the resistance value of any part of the contact chain from $r_0$ to ($k \times r_0$) can be detected. In other words, if a clear difference in the durability performance between the both patterns until the occurrence of the deterioration cannot be found, then this means that the process abnormality cannot be detected.

In the preparation of the defect detection test using the inspection patterns in accordance with the first through fourth embodiments, as an example, first and second auxiliary patterns having false-abnormal contact units of mutually different structures are prepared in addition to the inspection pattern. The preparation is carried out in the following steps <a> through <d>. It is assumed that one of the standard contact units of the inspection pattern as the highest-resistance part has a resistance value $r_{max}$, and the false-abnormal contact units of the first and second auxiliary patterns as the highest-resistance parts have resistance values ($k_1 \times r_{max}$) and ($k_2 \times r_{max}$), where $k_1 > k_2 > 1$, respectively.

<a> In a wiring process for the preparation, pattern units each including the inspection pattern and the first and second auxiliary patterns are formed on a semiconductor wafer.

<b> A current ((i) a constant current, (ii) a linearly increasing current, (iii) a stepwise increasing current, or (iv) a current based on a constant voltage, a linearly increasing voltage or a stepwise increasing voltage) is made to flow through the both ends of each pattern in the pattern unit.

<c> Data about durability performances (including an energy (i.e., the amount of the power consumption) consumed until the occurrence of the deterioration and a time until the occurrence of the deterioration) until the occurrence of the deterioration (e.g., resistance increase or fused wire occurring in the contact portion or wiring portion) of each pattern are obtained.

<d> Based on the obtained data about the durability performances, preparation is made for estimating the detection sensitivity characteristics, setting the current application conditions and evaluation criterion (of whether to judge normal or not), and conducting a defect detection test.

In this defect detection preparation, it is assumed that the pattern unit is formed through the normal manufacturing process.

In the aforementioned steps <a> through <d>, in the case where a current is made to flow through the first and second auxiliary patterns and the inspection pattern under the same conditions, if the durability performance of the first auxiliary pattern is clearly lower than that of the inspection pattern, but the durability performance of the second auxiliary pattern is clearly not different so much from that of the inspection pattern, then such a defect that the resistance value of any of the contact units is increased to $(k_1 \times r_{max})$ or more can be detected. Such a defect that the resistance value of any wiring part is increased to $(k_1 \times r_{max})$ or more can also be detected.

In this way, the auxiliary pattern corresponds to the inspection pattern with the exception that the auxiliary pattern has the false-abnormal contact unit as a simulation of a defect resulting from the process abnormality inserted therein. With the use of the auxiliary pattern, a part corresponding to the defect can be easily formed in an inspection pattern formed through the normal manufacturing process. Further, when a current is made to flow through the auxiliary pattern and the inspection pattern to evaluate the durability performance until the occurrence of the deterioration for each inspection pattern, the detection sensitivity of the defect can be easily estimated. In addition, the degree of a latent defect (the size of a void, the degree of the coverage defect, etc.) detected by the inspection using the inspection pattern can be estimated on the basis of the measured data about the auxiliary pattern.

<Inspection Method (Defect Detection Test)>

The defect detection test using the inspection pattern in accordance with the first through fourth embodiments is carried out, for example, by preparing the pattern units (including only the inspection pattern) or the pattern units (including the inspection pattern and the aforementioned first auxiliary pattern), and implementing the following steps <A> through <D>.

<A> In a wiring process of forming a multi-layer wiring structure of a product (i.e., a semiconductor chip) in a chip area of a semiconductor wafer, the pattern units each including the inspection pattern or the pattern units each including the inspection pattern and the first auxiliary pattern are formed on the semiconductor wafer.

<B> A current ((i) a constant current, (ii) a linearly increasing current, (iii) a stepwise increasing current, or (iv) a current based on a constant voltage, a linearly increasing voltage or a stepwise increasing voltage) is made to flow through the both ends of each pattern in the pattern units.

<C> A durability performance of each pattern is tested by causing the current to pass through each pattern until the occurrence of the deterioration (e.g., resistance increase or fused wire) of each pattern.

<D> Based on the durability performance, it is judged whether presence or absence of an abnormality in the wiring process.

In the aforementioned step <D>, the judgement is carried out according to the current application conditions. For example, when a current is made to flow until the inspection pattern is degraded, the judgement is carried out depending on whether or not the durability performances (including an energy consumed until the occurrence of the deterioration or a time until the occurrence of the deterioration) of the inspection pattern until the occurrence of the deterioration is at a level not smaller than an evaluation reference value. When a current is made to flow until the inspection pattern and the first auxiliary pattern are degraded, the judgement may also be made depending on whether or not a ratio between the durability performance of the inspection pattern until the occurrence of the deterioration and the durability performance of the auxiliary pattern until the occurrence of the deterioration is not smaller than an evaluation reference value. Further, when a current is made to flow under fixed conditions, the judgement is carried out depending on whether the deterioration of the inspection pattern takes place or not.

First Embodiment

An inspection pattern in accordance with the first embodiment of the present invention includes a contact chain. In order to suppress the electromigration effect in the multi-layer wiring portions, the contact chain of the first embodiment has a plurality of contact units arranged so as to be spaced by an interval "d" of no longer than 50 µm. Further, in the first embodiment, each of the contact units has a single contact portion.

A standard contact unit in the first embodiment includes a contact portion of a predetermined size. The contact portion in the standard contact unit in the first embodiment is referred to as a "standard contact portion."

A false-abnormal contact unit as a nonstandard contact unit in the first embodiment is similar to the standard contact unit, but the contact portion size of the false-abnormal contact unit is reduced. A single contact portion (of a size smaller than the standard contact portion) in the false-abnormal contact unit in the first embodiment is referred to as a "false-abnormal contact portion" or a "nonstandard contact portion."

In the contact chain of the inspection pattern in accordance with the first embodiment, all contact units are the standard contact units.

In the contact chain of the auxiliary pattern in accordance with the first embodiment, most contact units are the standard contact units, but the remaining contact unit (at least one contact unit) is the false-abnormal contact unit.

FIG. 1A is a schematic plan view showing an inspection pattern in accordance with the first embodiment of the present invention, and FIG. 1B is a schematic plan view showing an auxiliary pattern in accordance with the first embodiment of the present invention. In FIGS. 1A and 1B, a reference numeral 100 denotes an inspection pattern, and 110 denotes an auxiliary pattern. Further, a reference numeral 101 denotes an upper-layer wiring portion, 102 denotes a lower-layer wiring portion, 103 denotes a standard contact unit, and 103a denotes a standard contact portion. Furthermore, a reference numeral 104 denotes an electrode terminal, 105 denotes a false-abnormal contact unit, and 105a denotes a false-abnormal contact portion.

In the inspection pattern 100 of FIG. 1A and the auxiliary pattern 110 of FIG. 1B, an interval "d" (between central positions of the contact units) between the adjacent contact units is no longer than 50 µm so as to develop the backflow effect in the upper and lower-layer wiring portions 101 and 102, thereby suppressing the electromigration effect in the upper and lower-layer wiring portions 101 and 102. In general, the width of the upper-layer wiring portion 101 is set to be the same as that of the lower-layer wiring portion 102. All the standard contact portions 103a have the same size. The electrode terminal (pad electrode) 104 for current supply is provided for each of both ends of the contact chain.

The inspection pattern 100 of FIG. 1A includes a plurality of upper-layer wiring portions 101, a plurality of lower-layer wiring portions 102, a plurality of standard contact units 103, and two electrode terminals 104. In the inspection pattern 100 of FIG. 1A, the upper-layer wiring portions 101 (including the electrode terminals 104) and the lower-layer wiring portions 102 are electrically connected by the respective standard contact units 103 alternately in series so as to form a contact chain. Each of the standard contact units 103 includes a single standard contact portion 103a.

The auxiliary pattern 110 of FIG. 1B corresponds to the inspection pattern 100 of FIG. 1A, and the standard contact units 103 of the auxiliary pattern 110 have the same structure as those of the inspection pattern 100. But, in the auxiliary pattern 110, one of the contact units is replaced with the false-abnormal contact unit 105. The false-abnormal contact unit 105 includes a single false-abnormal contact portion 105a which is smaller in size than the standard contact portion 103a. For example, when the dimensions of the false-abnormal contact portion 105a in the width direction of the wiring portion and in the longitudinal direction of the wiring portion are reduced to ¾ of the dimensions of the standard contact portion 103a, the resistance of the false-abnormal contact portion of the false-abnormal contact unit 105 is $^{16}/_9$ of that of the standard contact portion of the standard contact unit 103.

The auxiliary pattern 110 corresponds to the inspection pattern 100, but, in the auxiliary pattern 110, one of the contact units is replaced with the false-abnormal contact unit 105 that has an increased resistance intentionally formed in the contact chain. In the auxiliary pattern 110, the false-abnormal contact unit 105 is provided as a simulation of a defect, the resistance of which is increased to $^{16}/_9$. Further, in the auxiliary pattern 110, the standard contact units 103 and the wiring portions are provided as normal components.

The preparation of a defect detection test using the aforementioned patterns 100 and/or 110 in accordance with the first embodiment is carried out, for example, in the following steps <1a> through <1d>.

<1a> In a wiring process for the preparation, pattern units each including the inspection pattern 100 and the auxiliary pattern 110 or pattern units each including the inspection pattern 100 and a plurality of auxiliary patterns 110 each having the false-abnormal contact portions 105a having mutually different contact portion sizes are formed on a semiconductor wafer.

<1b> A current ((i) a constant current, (ii) a linearly increasing current, (iii) a stepwise increasing current, or (iv) a current based on a constant voltage, a linearly increasing voltage or a stepwise increasing voltage) is made to flow through the both ends of each pattern 100 and/or 110.

<1c> Data about durability performances (including an energy consumed until the occurrence of the deterioration and a time until the occurrence of the deterioration) until the occurrence of the deterioration (e.g., resistance increase or fused wire) of each pattern are obtained.

<1d> Based on the obtained data about the durability performances, preparation is made for estimating the detection sensitivity characteristics, setting the current application conditions and evaluation criterion (of whether to judge normal or not), and conducting a defect detection test.

In this defect detection preparation, it is assumed that the pattern unit is formed through the normal manufacturing process.

In the aforementioned step <1a>, as already explained in FIGS. 5 and 6, the pattern unit is formed on or around the grid line (i.e., the scribe line) or the like of the semiconductor wafer. The pattern unit includes, for example, three types of auxiliary patterns 110 each having the false-abnormal contact portion 105a, the dimensions of which in its width and longitudinal directions of the wiring portion are set to be ¾, ½ and ¼ of those of the standard contact portion 103a respectively.

In the aforementioned step <1b>, the current application is carried out, for example, for all the pattern units prepared on a single semiconductor wafer or for some selected ones from all the pattern unit prepared on a single semiconductor wafer. Further, various current application conditions are used as tests as necessary. For example, a plurality of linearly increasing currents having mutually different current amounts per unit time, a plurality of stepwise increasing currents having mutually different stepwise increasing current amounts, or a plurality of stepwise increasing currents mutually different stepwise increase time intervals, can be employed.

In the aforementioned steps <1b> and <1c>, since the deterioration is caused by the Joule heat (in proportion to the square of the current value), the deterioration is accelerated as the application current value increases. The current application causes a part of the inspection pattern having the highest-resistance value to produce maximum heat and to be degraded in the shortest time. More specifically, the highest-resistance part in the inspection pattern 100 corresponds to any of the standard contact units 103, whereas, the highest-resistance part in the auxiliary pattern 110 corresponds to the false-abnormal contact unit 105. Thus any of the standard contact units 103 is randomly degraded in the inspection pattern 100, while the false-abnormal contact unit 105 is degraded in the auxiliary pattern 110. In the case where the resistance of the contact portion of the false-abnormal contact unit 105 corresponds to $^{16}/_9$ of the resistance of the contact portion of the standard contact unit 103, it is judged presence or absence of the detection sensitivity of the resistance increase by the $^{16}/_9$ times by estimating whether or not the durability performance of the auxiliary pattern 110 is clearly degraded more than that of the inspection pattern 100.

Next, a defect detection test using the inspection pattern in accordance with the first embodiment is carried out, for example, in the following steps <1A> through <1D>.

<1A> In a wiring process for forming a multi-layer wiring structure of a product (i.e., a semiconductor chip) in chip areas of a semiconductor wafer, pattern units each including the inspection pattern 100 or pattern units each including the inspection pattern 100 and the auxiliary pattern 110 are formed on the semiconductor wafer.

<1B> A current ((i) a constant current, (ii) a linearly increasing current, (iii) a stepwise increasing current, or (iv) a current based on a constant voltage, a linearly increasing voltage or a stepwise increasing voltage) is made to flow through both ends of each inspection pattern of the pattern unit.

<1C> A durability performance of each pattern is tested by causing the current to pass through each pattern until the occurrence of the deterioration (e.g., resistance increase or fused wire) of each pattern.

<1D> Based on the obtained durability performance, it is judged whether presence or absence of an abnormality in the wiring process.

In the aforementioned step <1B>, for example, a current ((i) a constant current, (ii) a linearly increasing current, (iii) a stepwise increasing current, or (iv) a current based on a constant voltage, a-linearly increasing voltage or a stepwise increasing voltage) is made to flow under a condition (which is the same as the condition set in the step <1d>). Further, the current application is carried out, for example, to all the pattern units prepared on the single semiconductor wafer or to some selected from these pattern units.

In the aforementioned step <1D>, the judgement is made according to the current application conditions. For example, in the case where a current is made to flow until the inspection pattern 100 is degraded, if the durability performance (such as an energy consumed until the occurrence of the deterioration or a time until the occurrence of the deterioration) is at a level not smaller than an evaluation reference value, then it is judged that the wiring process was normal. If the obtained durability performance is at a level less than the evaluation reference value, then it is judged that the wiring process was abnormal.

When a current is made to flow until the inspection pattern 100 and the auxiliary pattern 110 are degraded, the presence or absence of an abnormality in the wiring process is determined by the fact of whether or not a ratio in the durability performance between the inspection pattern 100 and the auxiliary pattern 110 is not smaller than an evaluation reference value.

Further, in the case where a current is made to flow under fixed conditions, if no deterioration occurs in the inspection pattern 100, then it is judged that the wiring process was normal. If deterioration occurs in the inspection pattern 100, then it is judged that the wiring process was abnormal.

As has been explained above, in accordance with the first embodiment, a current ((i) a constant current, (ii) a linearly increasing current, (iii) a stepwise increasing current, or (iv) a current based on a constant voltage, a linearly increasing voltage or a stepwise increasing voltage) is made to flow through the both ends of the inspection pattern having the contact units arranged so as to be spaced by the interval "d" of no longer than 50 µm to suppress the electromigration effect, the durability performance of the inspection pattern is obtained by causing the current to pass through each pattern until the occurrence of the deterioration (e.g., resistance increase or fused wire) of each pattern, and the presence or absence of a defect is evaluated on the basis of the obtained durability performance. Thus, the resistance values of the parts of the inspection pattern when the current is applied are directly reflected. That is, when the resistance of a defect part caused by the abnormal manufacturing process is larger than the resistance of highest-resistance one of the parts formed through the normal manufacturing process, the durability performance of the inspection pattern having the defect caused by the abnormal manufacturing process is lower than that of the inspection pattern formed through the normal manufacturing process. As a result, the highest resistance part caused by the abnormal manufacturing process can be quickly and efficiently detected in the semiconductor element manufacturing process, and thus it can be avoided that a semiconductor product including the defect be put on the marketplace. Therefore, the reliability of products to be put on the marketplace can advantageously increased.

Further, in the inspection patterns, an interval between the contact units is set at no longer than 50 µm to suppress resistance increase caused by the electromigration phenomenon. As a result, the possibility of erroneous judgement that a latent defect is present in the contact units can be reduced and the accurate defect detection can be advantageously achieved.

Further, in the auxiliary pattern 110, the false-abnormal contact unit 105 is provided as a simulation of a defect. The auxiliary pattern 110 can be easily formed through the normal manufacturing process.

Furthermore, the defect detection sensitivity can be easily estimated by passing a current through the auxiliary and inspection patterns 110 and 100 to evaluate the durability performance of each pattern until the occurrence of the deterioration. In addition, the degree of a latent defect (such as the size of a void or the degree of a degraded coverage) detected by inspecting the inspection pattern can be estimated on the basis of the measured data about the auxiliary pattern.

Second Embodiment

An inspection pattern in accordance with the second embodiment of the present invention includes a contact chain. In order to suppress the electromigration effect in the multi-layer wiring portions, the contact chain of the second embodiment has a plurality of contact units arranged so as to be spaced by an interval "d" of no longer than 5 µm. Further, in the second embodiment, each of the contact units has a plurality of contact portions arranged in a width direction (i.e., a direction perpendicular to a longitudinal direction of the contact chain) of the upper-layer wiring portion or lower-layer wiring portion. In this connection, the false-abnormal contact unit may be a contact unit having a single contact portion.

A standard contact unit in the second embodiment includes a predetermined number of contact portions which are arranged in the width direction and which have an identical contact portion size. A false-abnormal contact unit in the second embodiment corresponds to the standard contact unit with the exception that the false-abnormal contact unit includes a contact portion or portions smaller in number than the standard contact unit.

In the contact chain of the inspection pattern in accordance with the second embodiment, all contact units are the standard contact units. In the contact chain of the auxiliary pattern in accordance with the second embodiment, most contact units are the standard contact units, but the remaining contact unit (at least one contact unit) is the false-abnormal contact unit.

FIG. 2A is a schematic plan view showing an inspection pattern in accordance with the second embodiment of the present invention, and FIG. 2B is a schematic plan view showing an auxiliary pattern in accordance with the second embodiment of the present invention. In FIGS. 2A and 2B, a reference numeral 200 denotes an inspection pattern, and 210 denotes an auxiliary pattern. Further, a reference numeral 201 denotes an upper-layer wiring portion, 202 denotes a lower-layer wiring portion, 203 denotes a standard contact unit, 203a denotes a contact portion in the standard contact unit 203. Furthermore, a reference numeral 204 denotes an electrode terminal, 205 denotes a false-abnormal contact unit, and 205a denotes a contact portion in the false-abnormal contact unit 205.

In the inspection pattern 200 of FIG. 2A and the auxiliary pattern 210 of FIG. 2B, the interval "d" between the contact units adjacent to each other is no longer than 50 µm so as to develop the backflow effect in the upper and lower-layer wiring portions 201 and 202, thereby suppressing the electromigration effect in the upper and lower-layer wiring portions 201 and 202. In this embodiment, the width of the upper-layer wiring portion 201 is set to be the same as that of the lower-layer wiring portion 202. In this embodiment, all the contact portions 203a in the standard contact unit 203 and all the contact portions 205a in the false-abnormal contact unit 205 have the same size. The electrode terminal 204 for current application is provided at each of both ends of the contact chain.

The inspection pattern 200 of FIG. 2A includes a plurality of upper-layer wiring portions 201, a plurality of lower-layer wiring portions 202, a plurality of standard contact units 203, and two electrode terminals 204. In the inspection pattern 200 of FIG. 2A, the upper-layer wiring portions 201

(including the electrode terminals 204) and the lower-layer wiring portions 202 are electrically connected by the respective standard contact units 203 alternately in series so as to form a contact chain. Each of the standard contact units 203 includes five contact portions 203a arranged in the width direction of the upper or lower-layer wiring portion 201 and 202.

The auxiliary pattern 210 of FIG. 2B corresponds to the inspection pattern 200 of FIG. 2A, and the standard contact units 203 of the auxiliary pattern 210 have the same structure as those of the inspection pattern 200. But, in the auxiliary pattern 210, one of the contact units is replaced with the false-abnormal contact unit 205. The false-abnormal contact unit 205 includes three contact portions 205a smaller in number than the standard contact unit 203. The combined resistance of the contact portions of the false-abnormal contact units 205 is ⅗ of the combined resistance of the contact portions of the standard contact unit 203.

In the auxiliary pattern 210, one of the contact units is replaced with the false-abnormal contact unit 205 that has an increased resistance intentionally formed in the contact chain. In the auxiliary pattern 210, the false-abnormal contact unit 205 is provided as a simulation of a defect. The false-abnormal contact unit 205 (having three contact portions) corresponds to such a false-abnormal defect part as to increase the resistance to ⅗ times, while the standard contact unit 203 (having five contact portions) and wiring parts corresponds to normal parts.

The preparation of the defect detection test using the aforementioned patterns 200 and/or 210 in accordance with the second embodiment is carried out, for example, in the following steps <2a> through <2d>.

<2a> In a wiring process for the preparation, pattern units each including the inspection pattern 200 and the auxiliary pattern 210 or pattern units each including the inspection pattern 200 and a plurality of auxiliary patterns 210 including the false-abnormal contact portions 205a having mutually different contact portion are formed on a semiconductor wafer.

<2b> A current ((i) a constant current, (ii) a linearly increasing current, (iii) a stepwise increasing current, or (iv) a current based on a constant voltage, a linearly increasing voltage or a stepwise increasing voltage) is made to flow through the both ends of each pattern in the pattern unit.

<2c> Data about durability performances (including an energy consumed until the occurrence of the deterioration and a time until the occurrence of the deterioration) until the occurrence of the deterioration (e.g., resistance increase or fused wire) of each pattern are obtained.

<2d> Based on the obtained data about the durability performances, preparation is made for estimating the detection sensitivity characteristics, setting the current application conditions and evaluation criterion (of whether to judge normal or not), and conducting a defect detection test.

In this defect detection preparation, it is assumed that the pattern unit is formed through the normal manufacturing process. The details of the aforementioned steps <2a> through <2d> not described below are substantially the same as the details of the aforementioned steps <1a> through <1d> in the foregoing first embodiment.

In the aforementioned step <2a>, an auxiliary pattern, for example, having the false-abnormal contact unit 205 each including four, two, or one contact portion in the auxiliary pattern 210 is applied as necessary in the pattern unit.

In the aforementioned steps <2b> and <2c>, since the deterioration is caused by the Joule heat (in proportion to the square of the current value), the deterioration is accelerated as the application current value increases. The current application causes a part of the inspection pattern having the highest-resistance value to produce maximum heat and to be degraded in the shortest time. More specifically, the highest-resistance part in the inspection pattern 200 corresponds to any of the standard contact units 203 (having five contact portions), whereas, the highest-resistance part in the auxiliary pattern 210 corresponds to the false-abnormal contact unit 205 (having three contact portions). Thus any of the standard contact units 203 is randomly degraded in the inspection pattern 200, while the false-abnormal contact unit 205 is degraded in the auxiliary pattern 210. The combined resistance of the contact portions of the false-abnormal contact unit 205 is ⅗ of the combined resistance of the contact portions of the standard contact unit 203. Thus by examining whether or not the durability performance of the auxiliary pattern 210 is more clearly degraded than the durability performance of the inspection pattern 200, the presence or absence of the detection sensitivity of the ⅗-times resistance increase can be estimated.

As an example, in the inspection pattern 200 having eight hundred standard contact units (each having five contact portions) and a wiring width of 4.2 μm, an energy consumed until destruction is 23.9 kJ and a time until destruction is 56.5 sec. Whereas, in the auxiliary pattern 210 having a single false-abnormal contact unit 205 (each having three contact portions), seven hundred and ninety-nine standard contact units (each having five contact portions) and a width of the upper and lower-layer wiring portions of 4.2 μm, an energy consumed until destruction is 7.96 kJ and a time until destruction is 17.9 sec.

Next, the defect detection test using the inspection pattern in accordance with the second embodiment is carried out, for example, in the following steps <2A> through <2D>.

<2A> In a wiring process for forming a multi-layer wiring structure of a product (i.e., a semiconductor chip) in chip areas of a semiconductor wafer, pattern units each including the inspection pattern 200, or pattern units each including the inspection pattern 200 and the auxiliary pattern 210 are formed on the semiconductor wafer.

<2B> A current ((i) a constant current, (ii) a linearly increasing current, (iii) a stepwise increasing current, or (iv) a current based on a constant voltage, a linearly increasing voltage or a stepwise increasing voltage) is made to flow through both ends of each inspection pattern of the pattern unit.

<2C> A durability performance of each pattern is tested by causing the current to pass through each pattern until the occurrence of the deterioration (e.g., resistance increase or fused wire) of each pattern.

<2D> Based on the obtained durability performance, it is judged whether presence or absence of an abnormality in the wiring process.

The details of the aforementioned steps <2A> through <2D> not described below are substantially the same as the details of the aforementioned steps <1A> through <1D> of the first embodiment.

In the aforementioned step <2D>, the judgement is made according to the current application conditions. For example, in the case where a current is made to flow until the inspection pattern 200 is degraded, if the durability performance (such as an energy consumed until the occurrence of the deterioration or a time until the occurrence of the deterioration) is at a level not smaller than an evaluation reference value, then it is judged that the wiring process was normal. If the obtained durability performance is at a value less than the evaluation reference value, then it is judged that the wiring process was abnormal.

When a current is made to flow until the inspection pattern 200 and the auxiliary pattern 210 are degraded, the presence or absence of an abnormality in the wiring process is determined by the fact of whether or not a ratio in the durability performance between the inspection pattern 200 and the auxiliary pattern 210 is not smaller than an evaluation reference value.

Further, in the case where a current is made to flow under fixed conditions, if no deterioration occurs in the inspection pattern 200, then it is judged that the wiring process was normal. If deterioration occurs in the inspection pattern 200, then it is judged that the wiring process was abnormal.

As has been explained above, in accordance with the second embodiment, a current ((i) a constant current, (ii) a linearly increasing current, (iii) a stepwise increasing current, or (iv) a current based on a constant voltage, a linearly increasing voltage or a stepwise increasing voltage) is made to flow through both ends of the inspection pattern having the contact units arranged so as to be spaced by the interval "d" of no longer than 50 µm to suppress the electromigration effect, the durability performance is tested by causing the current to pass through each pattern until the occurrence of the deterioration (e.g., resistance increase or fused wire) of each pattern, and presence or absence of a defect is evaluated on the basis of the obtained durability performance. As a result, like the foregoing first embodiment, the highest-resistance part caused by the process abnormality can be quickly and efficiently detected in the semiconductor element manufacturing process, and a semiconductor product including the defect can be avoided from being put on the marketplace. Therefore, the reliability of products to be put on the marketplace can advantageously increased.

Further, in the auxiliary pattern 210, the false-abnormal contact unit 205 is provided as a simulation of a defect. The auxiliary pattern 210 can be easily formed through the normal manufacturing process.

Furthermore, as in the foregoing first embodiment, the defect detection sensitivity can be easily estimated by passing a current through the auxiliary and inspection patterns 110 and 100 to evaluate the durability performance of each pattern until the occurrence of the deterioration. In addition, the degree of a latent defect (such as the size of a void or the degree of a degraded coverage) detected by the inspection of the inspection pattern can be estimated on the basis of the measured data about the auxiliary pattern.

Further, since the size of the contact portion 205a in the false-abnormal contact unit 205 is the same as that of the contact portion 203a in the standard contact unit 203, a detection sensitivity characteristic can be obtained more accurately than that in the foregoing first embodiment having the false-abnormal contact portion 105a different in size from the standard contact portion 105a. In addition, since a plurality of contact portions are arranged in the direction perpendicular to the direction of the contact chain, there can be obtained a detection sensitivity which is more excellent than that in the case where a plurality of contact portions are arranged in a longitudinal direction of the contact chain.

Third Embodiment

An inspection pattern in accordance with the third embodiment of the present invention includes a contact chain. In order to suppress the electromigration effect in the multi-layer wiring portions, the contact chain of the third embodiment has a plurality of contact units arranged so as to be spaced by an interval "d" of no longer than 50 µm. Further, in the third embodiment, each of the contact units has a plurality of contact portions arranged in a longitudinal direction of the upper or lower-layer wiring portion. In the third embodiment, the false-abnormal contact unit may be a contact unit having a single contact portion.

A standard contact unit in the third embodiment includes a predetermined number of contact portions which are arranged in the longitudinal direction and which have an identical contact portion size. A false-abnormal contact unit in the third embodiment corresponds to the standard contact unit with the exception that the false-abnormal contact unit includes a contact portion or portions smaller in number than the standard contact unit.

In the contact chain of the inspection pattern in accordance with the third embodiment, all contact units are the standard contact units. In the contact chain of the auxiliary pattern in accordance with the third embodiment, most contact units are the standard contact units, but the remaining contact unit (at least one contact unit) is the false-abnormal contact unit.

FIG. 3A is a schematic plan view showing an inspection pattern in accordance with the third embodiment of the present invention, and FIG. 3B is a schematic plan view showing an auxiliary pattern in accordance with the third embodiment of the present invention. In FIGS. 3A and 3B, a reference numeral 300 denotes an inspection pattern, and 310 denotes an auxiliary pattern. Further, a reference numeral 301 denotes an upper-layer wiring portion, 302 denotes a lower-layer wiring portion, 303 denotes a standard contact unit, 303a denotes a contact portion in the standard contact unit 303. Furthermore, a reference numeral 304 denotes an electrode terminal, 305 denotes a false-abnormal contact unit, and 305a denotes a contact portion in the false-abnormal contact unit 305.

In the inspection pattern 300 of FIG. 3A and the auxiliary pattern 310 of the FIG. 3B, the interval "d" between the contact units adjacent to each other is no longer than 50 µm so as to develop the backflow effect in the upper and lower-layer wiring portions 301 and 302, thereby suppressing the electromigration effect in the upper and lower-layer wiring portions 301 and 302. In the third embodiment, all the contact portions 303a in the standard contact unit 303 and all the contact portions 305a in the false-abnormal contact unit 305 have the same size. The electrode terminal 304 for current application is provided at both ends of the contact chain.

The inspection pattern 300 of FIG. 3A includes a plurality of upper-layer wiring portions 301, a plurality of lower-layer wiring portions 302, a plurality of standard contact units 303, and two electrode terminals 304. In the inspection pattern 300 of FIG. 3A, the upper-layer wiring portions 301 (including the electrode terminals 304) and the lower-layer wiring portions 302 are electrically connected by the respective standard contact units 303 alternately in series so as to form a contact chain. Each of the standard contact units 303 includes two contact portions 303a arranged in the longitudinal direction of the upper or lower-layer wiring portion 301 and 302.

The auxiliary pattern 310 of FIG. 3B corresponds to the inspection pattern 300 of FIG. 3A, and the standard contact units 303 of the auxiliary pattern 310 have the same structure as those of the inspection pattern 300. But, in the auxiliary pattern 310, one of the contact units is replaced with the false-abnormal contact unit 305. The false-abnormal contact unit 305 includes one contact portion 305a smaller in number than the standard contact unit 303. The resistance of the contact portion of the false-abnormal contact unit 305 is twice the combined resistance of the contact portions of the standard contact unit 203.

In the auxiliary pattern 310, one of the contact units is replaced with the false-abnormal contact unit 305 that has an increased resistance intentionally formed in the contact chain. In the auxiliary pattern 310, the false-abnormal contact unit 305 is provided as a simulation of a defect. The false-abnormal contact unit 305 (having a single contact portion) corresponds to such a false-abnormal defect part as to increase the resistance twice, while the standard contact unit 303 (having two contact portions) and wiring parts corresponds to normal parts.

The preparation of the defect detection test using the aforementioned patterns 300 and/or 310 in accordance with the third embodiment is carried out, for example, in the following steps <3a> through <3d>.

<3a> In a wiring process for the preparation, pattern units each including the inspection pattern 300 and the auxiliary pattern 310 or pattern units each including the inspection pattern 300 and a plurality of auxiliary patterns 310 including the false-abnormal contact portions 305a having mutually different contact portion are formed on a semiconductor wafer.

<3b> A current ((i) a constant current, (ii) a linearly increasing current, (iii) a stepwise increasing current, or (iv) a current based on a constant voltage, a linearly increasing voltage or a stepwise increasing voltage) is made to flow through the both ends of each pattern in the pattern unit.

<3c> Data about durability performance (including an energy consumed until the occurrence of the deterioration and a time until the occurrence of the deterioration) until the occurrence of the deterioration (e.g., resistance increase or fused wire) of each pattern are obtained.

<3d> Based on the obtained data about the durability performances, preparation is made for estimating the detection sensitivity characteristics, setting the current application conditions and evaluation criterion (of whether to judge normal or not), and conducting a defect detection test.

In this defect detection preparation, it is assumed that the pattern unit is formed through the normal manufacturing process. The details of the aforementioned steps <3a> through <3d> not describe below are substantially the same as the details of the aforementioned steps <1a> through <1d> in the first embodiment.

In the aforementioned step <3a>, the auxiliary pattern, for example, having a modified structure of the false-abnormal contact unit 205, is applied as necessary. For example, when the standard contact unit 303 is arranged to have four contact portions, an auxiliary pattern having three or two contact portions 205a is applied.

In the aforementioned steps <3b> and <3c>, since the deterioration is caused by the Joule heat (in proportion to the square of the current value), the deterioration is accelerated as the application current value increases. The current application causes a part of the inspection pattern having the highest-resistance value to produce maximum heat and to be degraded in the shortest time. More specifically, the highest-resistance part in the inspection pattern 300 corresponds to any of the standard contact units 303 (having five contact portions, whereas, the highest-resistance part in the auxiliary pattern 310 corresponds to the false-abnormal contact unit 305 (having three contact portions). Thus any of the standard contact units 303 is randomly degraded in the inspection pattern 300, while the false-abnormal contact unit 305 is degraded in the auxiliary pattern 310. The resistance of the contact portion of the false-abnormal contact unit 305 is twice the combined resistance of the contact portions of the standard contact unit 303. Thus by examining whether or not the durability performance of the auxiliary pattern 310 is more clearly degraded than the durability performance of the inspection pattern 300, presence or absence of the detection sensitivity of the double resistance increase can be estimated.

Next, the defect detection test using the inspection pattern in accordance with the third embodiment is carried out, for example, in the following steps <3A> through <3D>.

<3A> In a wiring process for forming a multi-layer wiring structure of a product (i.e., a semiconductor chip) in a chip areas of a semiconductor wafer, pattern units each including the inspection pattern 300 or pattern units each including the inspection pattern 300 and the auxiliary pattern 310 are formed on the semiconductor wafer.

<3B> A current ((i) a constant current, (ii) a linearly increasing current, (iii) a stepwise increasing current, or (iv) a current based on a constant voltage, a linearly increasing voltage or a stepwise increasing voltage) is made to flow through the both ends of each pattern in the pattern unit.

<3C> A durability performance of each pattern is tested by causing the current to pass through each pattern until the occurrence of the deterioration (e.g., resistance increase or fused wire) of each pattern.

<3D> Based on the obtained durability performance, it is judged whether presence or absence of an abnormality in the wiring process.

The details of the aforementioned steps <3A> through <3D> not described below are substantially the same as the details of the aforementioned steps <1A> through <1D> of the first embodiment.

In the aforementioned step <3D>, the judgement is made according to the current application conditions. For example, in the case where a current is made to flow until the inspection pattern 300 is degraded, if the durability performance (such as an energy consumed until the occurrence of the deterioration or a time until the occurrence of the deterioration) is at a level not smaller than an evaluation reference value, then it is judged that the wiring process was normal. If the obtained durability performance is at a value less than the evaluation reference value, then it is judged that the wiring process was abnormal.

When a current is made to flow until the inspection pattern 300 and the auxiliary pattern 310 are degraded, the presence or absence of an abnormality in the wiring process is determined by the fact of whether or not a ratio in durability performance between the inspection pattern 300 and auxiliary pattern 310 is not smaller than an evaluation reference value.

Further, in the case where a current is made to flow under fixed conditions, if no deterioration occurs in the inspection pattern 300, then it is judged that the wiring process was normal. If deterioration occurs in the inspection pattern 300, then it is judged that the wiring process was abnormal.

As has been explained above, in accordance with the third embodiment, a current ((i) a constant current, (ii) a linearly increasing current, (iii) a stepwise increasing current, or (iv) a current based on a constant voltage, a linearly increasing voltage or a stepwise increasing voltage) is made to flow through both ends of an inspection pattern having contact units an interval of no longer than 50 μm to suppress the electromigration effect, the durability performance is tested by causing the current to pass through each pattern until the occurrence of the deterioration (e.g., resistance increase or fused wire) of each pattern, and presence or absence of a defect is evaluated on the basis of the obtained durability performance. As a result, like the foregoing first embodiment, the highest-resistance part caused by the process abnormality can be quickly and efficiently detected in the semiconductor element manufacturing process, and it can be prevented that a semiconductor product including the defect be put on the marketplace. Therefore, the reliability of products to be put on the marketplace can advantageously increased.

Further, in the auxiliary pattern 310, the false-abnormal contact unit 305 is provided as a simulation of a defect. The auxiliary pattern 310 can be easily formed through the normal manufacturing process.

Furthermore, as in the foregoing first embodiment, the defect detection sensitivity can be easily estimated by passing a current through the auxiliary and inspection patterns 310 and 300 to evaluate the durability performance of each inspection pattern until the occurrence of the deterioration. In addition, the degree (the size of a void, the degree of a coverage defect or the like) of a latent defect detected by the inspection of the inspection pattern can be estimated on the basis of the measured data about the auxiliary pattern.

Furthermore, since the size of the contact portion 305a in the false-abnormal contact unit 305 is the same as that of the contact portion 303a in the standard contact unit 303, a detection sensitivity characteristic can be obtained more accurately than that in the foregoing first embodiment having the false-abnormal contact portion 305a different in size from the standard contact portion 105a.

Fourth Embodiment

An inspection pattern in accordance with the fourth embodiment of the present invention includes a contact chain. In order to suppress the electromigration effect in the multi-layer wiring portions, the contact chain of the fourth embodiment has a plurality of contact units arranged so as to be spaced by an interval "d" of no longer than 50 μm. Further, in the fourth embodiment, each of the contact units has a plurality of contact portions arranged in a longitudinal direction and a width direction of the upper or lower-layer wiring portion. In this connection, the false-abnormal contact unit may be a contact unit having a plurality of contact portions arranged only in the width direction, or a contact unit having a single contact portion.

A standard contact unit in the fourth embodiment includes (m×n) contact portions arranged in m columns (where "m" is an integer satisfying m≧2) in the width direction and in n rows (where "n" is an integer satisfying n≧2). Each contact column has n contact portions and each contact row has m contact portions.

In the contact chain of the inspection pattern in accordance with the fourth embodiment, all contact units are the standard contact units. In the contact chain of the auxiliary pattern in accordance with the fourth embodiment, most contact units are the standard contact units, but the remaining contact unit (at least one contact unit) is the false-abnormal contact unit. As the false-abnormal contact unit in the fourth embodiment, there is the following example (i) through (iv).

(i) Only the contact column number (width direction) is smaller than the number of the standard contact units, and the contact row number (longitudinal direction), the number of contact portions in each contact column, and the number of contact portions in each contact row are the same as those of the standard contact unit.

(ii) Only the contact row number is smaller than that of the standard contact unit, and the contact column number, the number of the contact portions in each contact column, and the number of the contact portions in each contact row are the same as those of the standard contact unit.

(iii) Only the contact column number and contact row number are the same as those of the standard contact unit, and the number of contact portions in any contact column and/or contact row is smaller than that of the standard contact unit.

(iv) The contact column number and/or contact row number is smaller than that of the standard contact unit, and the number of contact portions in any contact column and/or contact row is smaller than that of the standard contact unit.

In the contact chain of the inspection pattern in accordance with the fourth embodiment, all contact units are the standard contact units. In the contact chain of the auxiliary pattern in accordance with the fourth embodiment, most contact units are the standard contact units, but the remaining contact unit (at least one contact unit) is the false-abnormal contact unit.

Figure 4B:
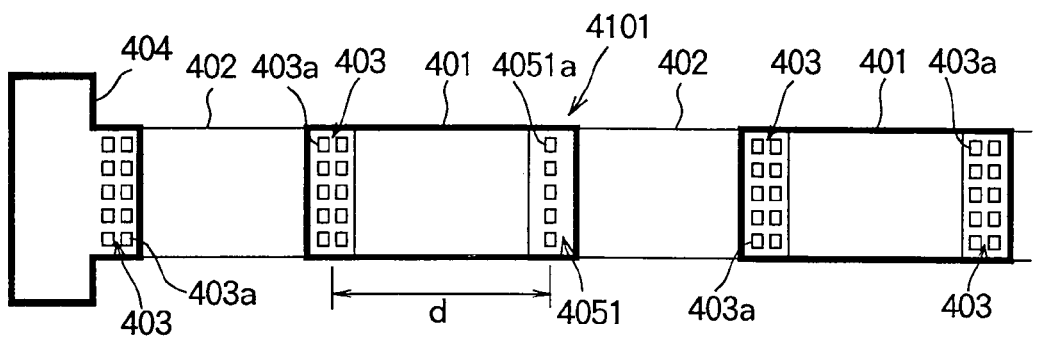
FIGS. 4B, 4C and 4D are schematic plan views showing auxiliary patterns in accordance with the fourth embodiment, respectively.
Figure 4C:
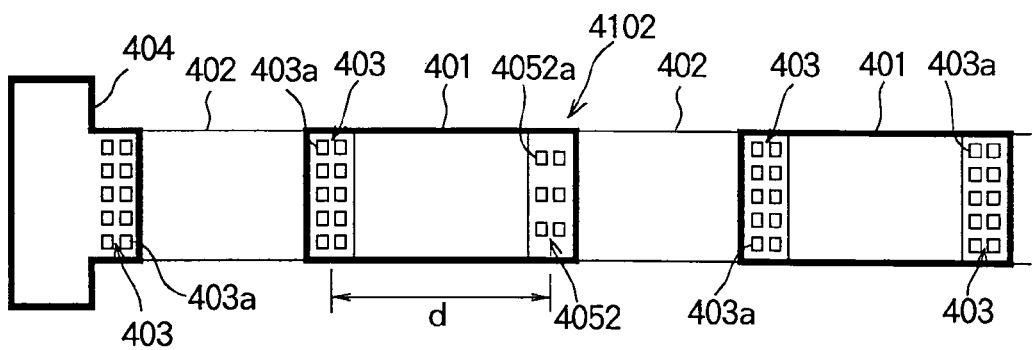
Figure 4D:
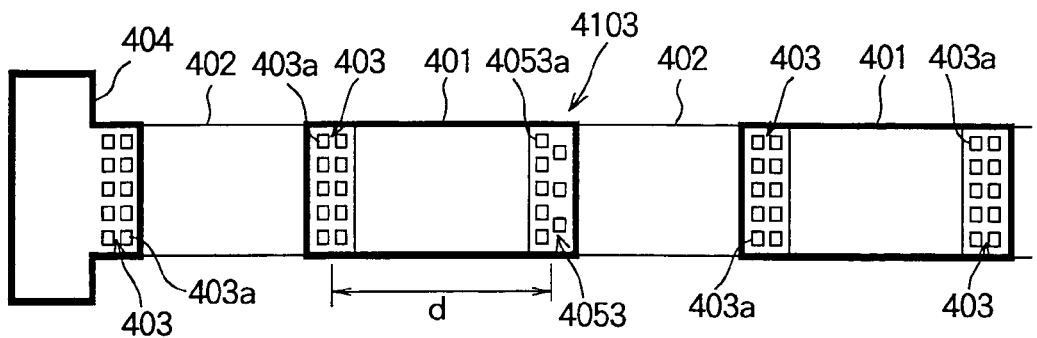

FIG. 4A is a schematic plan view showing an inspection pattern in accordance with the fourth embodiment of the present invention, and FIGS. 4B, 4C and 4D are schematic plan views showing the auxiliary patterns in accordance with the fourth embodiment of the present invention. In FIGS. 4A, 4B, 4C and 4D, a reference numeral 400 denotes an inspection pattern, and numerals 4101, 4102 and 4103 denote auxiliary patterns. Further, a reference numeral 401 denotes an upper-layer wiring portion, 402 denotes a lower-layer wiring portion, 403 denotes a standard contact unit, 403a denotes a contact portion in the standard contact unit 403. Furthermore, a reference numeral 404 denotes an electrode terminal, numerals 4051, 4052 and 4053 denote false-abnormal contact units, and numerals 4051a, 4052a and 4053a denote contact portions in the false-abnormal contact units 4051, 4052 and 4053.

In the inspection pattern 400 of FIG. 4A and the auxiliary patterns 4101 through 4103 of FIGS. 4B, 4C and 4D, the interval "d" between the contact units adjacent to each other is no longer than 50 μm so as to develop the backflow effect in the upper and lower-layer wiring portions 401 and 402, thereby suppressing the electromigration effect in the upper and lower-layer wiring portions 401 and 402. In the fourth embodiment, the widths of the upper and lower-layer wiring portions 401 and 402 are all the same. Further, all the contact portions 403a in the standard contact unit 403 and all the contact portions 4051a, 4052a, and 4053a in the false-abnormal contact units 4051 through 4053 have the same size. The electrode terminal 404 for current application is provided at each of both ends of the contact chain.

The inspection pattern 400 of FIG. 4A includes a plurality of upper-layer wiring portions 401, a plurality of lower-layer wiring portions 402, a plurality of standard contact units 403, and two electrode terminals 404. In the inspection pattern 400 of FIG. 4A, the upper-layer wiring portions 401 (including the electrode terminals 404) and the lower-layer wiring portions 402 are electrically connected by the respective standard contact units 403 alternately in series so as to form a contact chain. Each of the standard contact units 403 includes ten contact portions 403a arranged in two columns and in five rows.

The auxiliary pattern 4101 of FIG. 4B corresponds to the inspection pattern 400 of FIG. 4A, and the standard contact units 403 of the auxiliary pattern 4101 have the same structure as those of the inspection pattern 400. But, in the auxiliary pattern 4101, one of the contact units is replaced with the false-abnormal contact unit 4051. The false-abnormal contact unit 4051 includes five contact portions 4051a which are smaller in number than the contact portion column number and are arranged in one column and in five rows. The combined resistance of the contact portions of the false-abnormal contact unit 4051 is twice the combined resistance of the contact portions of the standard contact unit 403.

As shown in FIG. 4B, in the auxiliary pattern 4101, one of the contact units is replaced with the false-abnormal contact unit 4051 that has an increased resistance intentionally formed in the contact chain. In the auxiliary pattern 4051, the false-abnormal contact unit 4051 is provided as a simulation of a defect. The false-abnormal contact unit 4051 (having five contact portions 4051*a*) corresponds to such a false-abnormal defect part as to increase the resistance twice, while the standard contact unit 403 (having ten contact portions 403*a*) and wiring parts corresponds to normal parts.

The auxiliary pattern 4102 of FIG. 4C corresponds to the inspection pattern 400 of FIG. 4A, and the standard contact units 403 of the auxiliary pattern 4101 have the same structure as those of the inspection pattern 400. But, in the auxiliary pattern 4102, one of the contact units is replaced with the false-abnormal contact unit 4052. The false-abnormal contact unit 4052 includes six contact portions 4052*a* which are smaller in number than the contact portion column number and are arranged in two columns and in three rows. The combined resistance of the contact portions of the false-abnormal contact unit 4052 is $10/6$ ($=5/3$) times of the combined resistance of the contact portions of the standard contact unit 403.

As shown in FIG. 4C, in the auxiliary pattern 4102, one of the contact units is replaced with the false-abnormal contact unit 4052 that has an increased resistance intentionally formed in the contact chain. In the auxiliary pattern 4052, the false-abnormal contact unit 4052 is provided as a simulation of a defect. The false-abnormal contact unit 4102 (having six contact portions 4052*a*) corresponds to such a false-abnormal defect part as to increase the resistance to $10/6$ ($=5/3$) times, and the standard contact unit 403 (having ten contact portions 403*a*) and wiring parts corresponds to normal parts.

The auxiliary pattern 4103 of FIG. 4D corresponds to the inspection pattern 400 of FIG. 4A, and the standard contact units 403 of the auxiliary pattern 4103 have the same structure as those of the inspection pattern 400. But, in the auxiliary pattern 4103, one of the contact units is replaced with the false-abnormal contact unit 4053. The false-abnormal contact unit 4053 includes eight contact portions 4053*a* which are smaller in number than the contact portion column number and are arranged in two columns (one of which includes five rows, and the other of which includes three rows). The combined resistance of the contact portions 4053*a* of the false-abnormal contact unit 4053 is $10/8$ ($=5/4$) times of the combined resistance of the contact portions of the standard contact unit 403.

As shown in FIG. 4D, in the auxiliary pattern 4103, one of the contact units is replaced with the false-abnormal contact unit 4053 that has an increased resistance intentionally formed in the contact chain. In the auxiliary pattern 4053, the false-abnormal contact unit 4053 is provided as a simulation of a defect. The false-abnormal contact unit 4103 (having eight contact portions 4053*a*) corresponds to such a false-abnormal defect part as to increase the resistance to $10/8$ ($=5/4$) times, and the standard contact unit 403 (having ten contact portions 403*a*) and wiring parts corresponds to normal parts.

The preparation of the defect detection test using the aforementioned patterns 400, 4101, 4102, and 4103 in accordance with the fourth embodiment is carried out, for example, in the following steps <4a> through <4d>.

<4a> In a wiring process for the preparation, pattern units each including the inspection pattern 400 and the auxiliary pattern 4101 or pattern units each including the inspection pattern 300 and a plurality of auxiliary patterns 4101, 4102 and 4103 including the false-abnormal contact portions having mutually different contact portion are formed on a semiconductor wafer.

<4b> A current ((i) a constant current, (ii) a linearly increasing current, (iii) a stepwise increasing current, or (iv) a current based on a constant voltage, a linearly increasing voltage or a stepwise increasing voltage) is made to flow through the both ends of each pattern in the pattern unit.

<4c> Data about durability performance (including an energy consumed until the occurrence of the deterioration and a time until the occurrence of the deterioration) until the occurrence of the deterioration (e.g., resistance increase or fused wire) of each pattern are obtained.

<4d> Based on the obtained data about the durability performances, preparation is made for estimating the detection sensitivity characteristics, setting the current application conditions and evaluation criterion (of whether to judge normal or not), and conducting a defect detection test.

In this defect detection preparation, it is assumed that the pattern unit is formed through the normal manufacturing process. The details of the aforementioned steps <4a> through <4d> not describe below are substantially the same as the details of the aforementioned steps <1a> through <1d> in the first embodiment.

In the aforementioned step <4a>, an auxiliary pattern wherein the structures of the false-abnormal contact units 4051 through 4053 of the auxiliary patterns 4101 through 4103 are modified as necessary is applied in the pattern unit. For example, when the standard contact units 403 has contact portions arranged in four columns, an auxiliary pattern of false-abnormal contact units 4051 having contact portions arranged in three or two columns in the auxiliary pattern 4101, is applied. Further, an auxiliary pattern of abnormal contact units 4052 having contact portions arranged in four, two or one row in the auxiliary pattern 4102 is applied. An auxiliary pattern of abnormal contact units 4053 having nine, seven, or one contact portion in the auxiliary pattern 4103 is applied.

In the aforementioned steps <4b> and <4c>, since the deterioration is caused by the Joule heat (in proportion to the square of the current value), the deterioration is accelerated as the application current value increases. The current application causes a part of the inspection pattern having the highest-resistance value to produce maximum heat and to be degraded in the shortest time. More specifically, the highest-resistance part corresponds to any of the standard contact units 403 (having ten contact portions) in the inspection pattern 400, and corresponds to the false-abnormal contact unit 4051 (having five contact portions), the false-abnormal contact unit 4052 (having six contact portions) or the false-abnormal contact unit 4053 (having eight contact portions) in the auxiliary pattern 4101, 4102 or 4103. For this reason, in the inspection pattern 400, the standard contact unit 403 having the highest-resistance is degraded and its deterioration location randomly take place. Meanwhile, in the auxiliary patterns 4101, 4102 and 4103, deterioration occurs in the false-abnormal contact unit 4051, 4052 or 4053. The combined resistance of the contact portions of the false-abnormal contact units 4051, 4052 and 4053 are 2, $10/6$ and $^{10}/_8$ of the combined resistance of the contact portions of the standard contact unit 403 respectively. Thus, by examining the fact of whether or not the durability performance of the auxiliary pattern 4101, 4102 or 4103 is more clearly degraded than that of the inspection pattern 400, presence or absence of the detection sensitivity of the double resistance increase can be examined.

Next, the defect detection test using the inspection pattern in accordance with the fourth embodiment is carried out, for example, in the following steps <4A> through <4D>.

<4A> In a wiring process for forming a multi-layer wiring structure of a product (i.e., a semiconductor chip) in a chip area of a semiconductor wafer, pattern units each including the inspection pattern 400 or pattern units each including the inspection pattern 400 and any of the auxiliary patterns 4101 through 4103 is formed on a semiconductor wafer.

<4B> A current ((i) a constant current, (ii) a linearly increasing current, (iii) a stepwise increasing current, or (iv) a current based on a constant voltage, a linearly increasing voltage or a stepwise increasing voltage) is made to flow through the both ends of each pattern in the pattern unit.

<4C> A durability performance of each pattern is tested by causing the current to pass through each pattern until the occurrence of the deterioration (e.g., resistance increase or fused wire) of each pattern.

<4D> Based on the obtained durability performance, it is judged whether or not an abnormality took place in the wiring process.

In this connection, the details of the aforementioned steps <4A> through <4D> not shown below is substantially the same as the details of the aforementioned steps <1A> through <1D> of the first embodiment.

In the aforementioned step <4D>, the judgement is made according to the current application conditions. For example, in the case where a current is made to flow until the inspection pattern 400 is degraded, if the durability performance (including an energy consumed until the occurrence of the deterioration and a time until the occurrence of the deterioration) is at a level not smaller than an evaluation reference value, then it is judged that the wiring process was normal. If the obtained durability performance is at a level smaller than the evaluation reference value, then it is judged that the wiring process was abnormal.

In the case where a current is made to flow until any of the inspection pattern 400 and the auxiliary patterns 4101 through 4103 is degraded, presence or absence of an abnormality in the wiring process is determined by the fact of whether or not a ratio in durability performance between the inspection pattern 400 and any of auxiliary patterns 4101 through 4103 is not smaller than an evaluation reference value.

Further, in the case where a current is made to flow under fixed conditions, if no deterioration occurs in the inspection pattern 400, then it is judged that the wiring process was normal. If deterioration occurs in the inspection pattern 400, then it is judged that an abnormality took place in the wiring process.

As has been explained above, in accordance with the fourth embodiment, a current ((i) a constant current, (ii) a linearly increasing current, (iii) a stepwise increasing current, or (iv) a current based on a constant voltage, a linearly increasing voltage or a stepwise increasing voltage) is made to flow through the both ends of the inspection pattern of the contact units spaced by the interval "d" of no longer than 50 μm to suppress the electromigration effect, the durability performance is tested by causing the current to pass through each pattern until the occurrence of the deterioration (e.g., resistance increase or fused wire) of each pattern, and presence or absence of a defect is evaluated on the basis of the durability performance. As a result, as in the foregoing first embodiment, the highest-resistance part resulting from the process abnormality can be quickly and efficiently detected in the semiconductor element manufacturing process, and a semiconductor product having the defect can be prevented from being put on the marketplace. Therefore, the reliability of products to be put on the marketplace can advantageously increased.

Further, in the auxiliary patterns 4101, 4102 and 4103, the false-abnormal contact units are provided as a simulation of a defect. The auxiliary patterns 4101, 4102 and 4103 can be easily formed through the normal manufacturing process.

Furthermore, the defect detection sensitivity can be easily estimated by passing a current through the auxiliary and inspection patterns 4101, 4102, 4103 and 400 to evaluate the durability performance of each inspection pattern until the occurrence of the deterioration, as in the first embodiment. In addition, the degree of a latent defect (such as the size of a void or the degree of a degraded coverage) detected by the inspection of the inspection pattern can be estimated on the basis of the measured data about the auxiliary pattern.

Furthermore, since the size of the contact portions of the false-abnormal contact unit 4101 through 4103 is the same as that of the standard contact unit 403, a detection sensitivity characteristic can be obtained with an accuracy higher than that of the foregoing first embodiment. Furthermore, since the contact unit is designed to have contact portions arranged in plural columns and in plural rows, a detection sensitivity characteristic can be obtained which is wider than in the second embodiment of the contact units in one column and in the third embodiment of the contact units in one row.

The explanation has been made in connection with the case where the defect caused by the process abnormality such as the oxide remaining on the bottom of the contact portion by etching, a tungsten filled cavity or an abnormal interface at the ceiling part of the contact portion is generated in contact units (including the boundary between the wiring and joint parts) in the foregoing first through fourth embodiments of the present invention. However, it is also possible to detect a defect associated with metal material in the wiring (such as the modification and reaction of contact interface, defect inclusion of the metal material itself caused by or device trouble, or reduction of a metal coverage). Further, although the explanation has been made as to the two-layer wiring portions structure in the foregoing first through fourth embodiments of the present invention, a multi-layer wiring structure of three or more-layer wiring portion may be employed. In addition, with respect to even the material of the multi-layer wiring structure, various materials generally used widely may be used.

Fifth Embodiment

Figure 8:
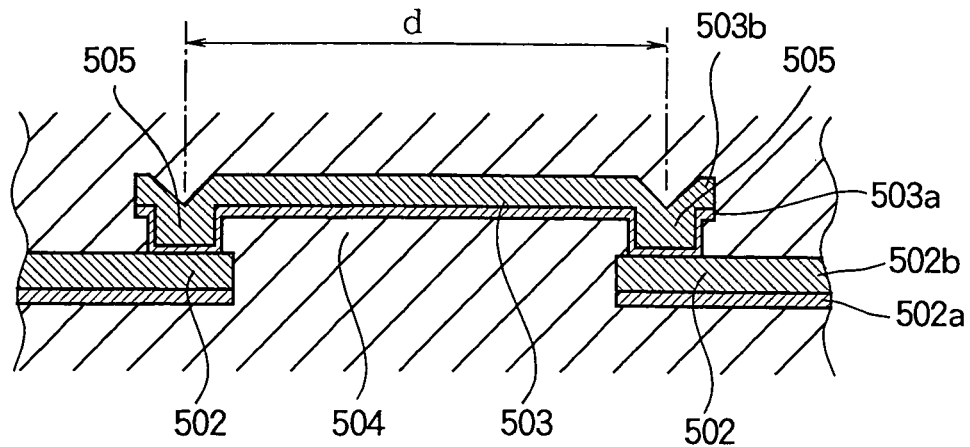
FIG. 8 is schematic vertical cross-sectional view showing the structure of the inspection pattern taken along a line $S_8$—$S_8$ in FIG. 7.

FIG. 7 is a schematic plan view, with certain part omitted, showing an inspection pattern 501 for use in an inspection method in accordance with the fifth embodiment of the present invention. FIG. 8 is a schematic vertical cross-sectional view showing the inspection pattern taken along a line $S_8$—$S_8$ in FIG. 7.

The inspection patterns 501 are formed in regions other than the chip areas (e.g., on or around a scribe line) on a semiconductor wafer or in TEG regions in the chip areas on a semiconductor wafer in order to detect a latent defect in a multi-layer wiring structure formed on the semiconductor wafer. In this specification, the term "latent defect" is used as a light defect (e.g., avoid of small size in the contact portion of the multi-layer wiring structure, a slightly degraded coverage of the multi-layer wiring structure, or the like) having the following meaning. An abnormality due to the latent defect cannot be detected (that is, measured values regarding the multi-layer wiring structure are within normal ranges) on the basis of the electrical characteristics (e.g., a resistance value, presence or absence of a wiring short-circuit, and so on) of the multi-layer wiring structure measured in the conventional probing process as one of the process for inspecting the characteristic of the semiconductor device. However, when the semiconductor device as a product put on the marketplace actually continuously used, there is a possibility that a latent defect causes a failure such as the fusing and breaking of the multi-layer wiring structure.

The inspection pattern 501 is used to perform the electrical characteristic inspection that cannot be conducted (because this type of inspection involves the fusing and breaking of the multi-layer wiring structure) for the multi-layer wiring structure of the chip area (which will be a semiconductor product to be put on a marketplace) functioning as a circuit. The inspection pattern 501 is formed on the semiconductor wafer through a process common to a process for forming the chip area on the semiconductor wafer. Further, it is desirable that the inspection pattern 501 (which is a multi-layer wiring structure for inspection) be formed so as to include a structure which is the same as or similar to a multi-layer wiring structure of the chip area (which is a multi-layer wiring structure as a part of a semiconductor product). When a latent defect is detected through the inspection of the inspection pattern 501, there can be a high possibility that a similar latent defect is present even in the multi-layer wiring structure of the chip area formed through a process common to a process for forming the inspection pattern.

As shown in FIGS. 7 and 8, the inspection pattern 501 includes a plurality of lower-layer wiring portions 502 arranged so as to be spaced at a distance, a plurality of upper-layer wiring portions 503 arranged so as to be spaced at a distance, and an insulating layer 504 provided between the plurality of lower-layer wiring portions 502 and the plurality of upper-layer wiring portions 503. The inspection pattern 501 also includes a plurality of contact units 505 which electrically connects the plurality of lower-layer wiring portions 502 and the plurality of upper-layer wiring portions 503 so as to form a contact chain including the plurality of lower-layer wiring portions 502 and the plurality of upper-layer wiring portions 503 alternately connected in series. The inspection pattern 501 further includes a pair of electrode terminals 506 and 507, wherein the electrode terminal 506 is electrically connected to one end of the contact chain, and the electrode terminal 507 is electrically connected to the other end of the contact chain.

In the fifth embodiment, each contact unit 505 includes a single contact portion 505a formed in a single contact hole. In FIG. 7, a central part of the contact chain is omitted. Further, the plan view shape of the contact chain is not limited to the shape shown in FIG. 7.

In the fifth embodiment, a length of each lower-layer wiring portion 502, a length of each upper-layer wiring portion 503, and a position of each contact unit 505 are set in such away that an interval "d" between ones (that is, between central positions of the contact units 505) of the plurality of contact units 505 adjacent to each other in a longitudinal direction of the lower-layer wiring portions 502 or the upper-layer wiring portions 503 is no longer than 50 µm. When the interval "d" is set at a value of no longer than 50 µm, the deterioration of the upper or lower-layer wiring portions 503 or 502 caused by the electromigration effect does not take place. It has been confirmed from actual tests (by passing a current through the inspection pattern and subsequently observing it using a microscope) that deterioration caused by the electromigration effect is not developed in the wiring portion (Al wiring portion) of no longer than 50 µm.

As mentioned above, the wiring portion will not be degraded by the electromigration effect when the wiring portion is no longer than 50 µm. This is considered to be because the backflow effect remarkably develops in the wiring portion having a short length. The reason why the backflow effect remarkably develops in the short-length wiring portion is as follows. That is, in the case of the short-length wiring portion, as atoms forming the wiring portion positioned upstream of an electron flow move (or migrate) downstream of the electron flow, the density of such atoms becomes high in the vicinity of a downstream end of the electron flow in a short time and thus the backflow effect (resulting from the fact that the high-density atoms downstream of the electron flow cause other atoms to be forced toward the upstream side of the electron flow) becomes great. In other words, in the case of a long wiring portion, even when the pressure of the electron flow causes the atoms forming the wiring portion present upstream of the electron flow to move (or migrate) toward downstream of the electron flow so that the atoms forming the wiring portion become high in density in the vicinity of the downstream end of the electron flow, the backflow effect cannot affect a part away from the vicinity of the downstream end of the electron flow (that is, an upstream part of the electron flow).

Further, in the fifth embodiment, the length of each lower-layer wiring portion 502, the length of each upper-layer wiring portion 503, and the position of each contact unit 505 are set in such a way that the interval "d" between ones (that is, between central positions of the contact units 505) of the plurality of contact units 505 adjacent to each other in a longitudinal direction of the lower-layer wiring portions 502 or the upper-layer wiring portions 503 is no shorter than 0.4 µm.

A specific example of the dimensions of the inspection pattern 501 in the fifth embodiment is as follows. The interval "d" is 5 µm, an opening width of the contact hole is on the order of 0.1 µm through 2 µm, and a depth of the contact hole is on the order of 0.1 µm through 5 µm. Further, widths of the lower and upper-layer wiring portions 502 and 503 are on the order of 0.1 µm through 10 µm, and thickness of the lower and upper-layer wiring portions 502 and 503 are on the order of 0.1 µm through 2 µm. These values are given as an example and the dimensions of the respective parts in the present invention are not limited to these values.

As shown in FIG. 8, the plurality of lower-layer wiring portions 502 are made of a metal. The plurality of upper-layer wiring portions 503 and the plurality of contact units 505 are also made of a metal. As shown in FIG. 8, the upper-layer wiring portions 503 and the contact units 505 are made of the same metal.

The lower-layer wiring portion 502 includes a barrier metal 502a and a main wiring layer 502b formed thereon. The upper-layer wiring portion 503 includes a barrier metal 503a and a main wiring layer 503b formed thereon. The materials of the barrier metals 502a and 503a is, for example, TiN, Ti, $TiSi_2$, $CoSi_2$ and the like. The barrier metals 502a and 503a are formed, for example, by a sputtering method or a CVD method. The material of the main wiring layers 502b and 503b is, for example, Al. Further, the materials of the main wiring layers 502b and 503b may be, an alloy of aluminum, a copper metal, an alloy of copper, and the like. The main wiring layers 502b and 503b are formed, for example, by a sputtering method. Further, when the main wiring layers 502b and 503b are made of copper, they can also be formed by a plating method.

Figure 9:
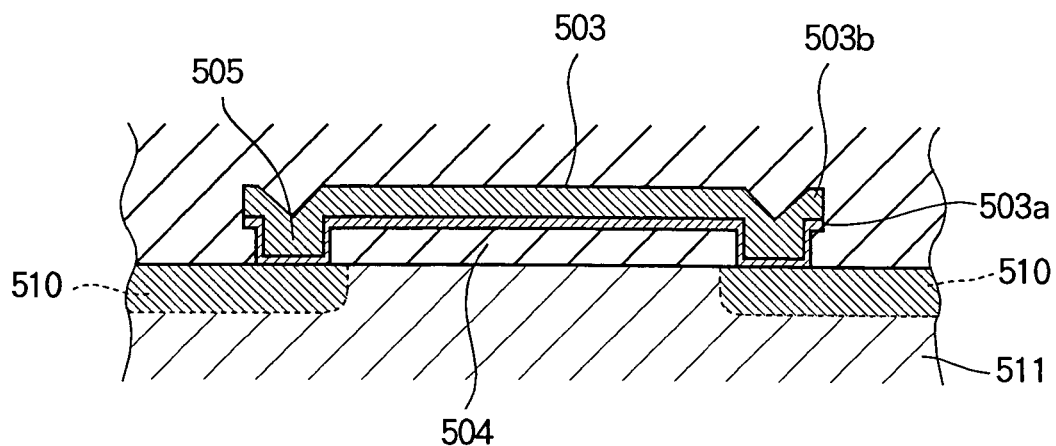
FIG. 9 is a schematic vertical cross-sectional view showing another structure of the inspection pattern in accordance with the fifth embodiment.

Further, as shown in FIG. 9, lower-layer wiring portions 510 may be formed in the form of impurity layers obtained by diffusing impurities in a semiconductor substrate 511.

Figure 10:
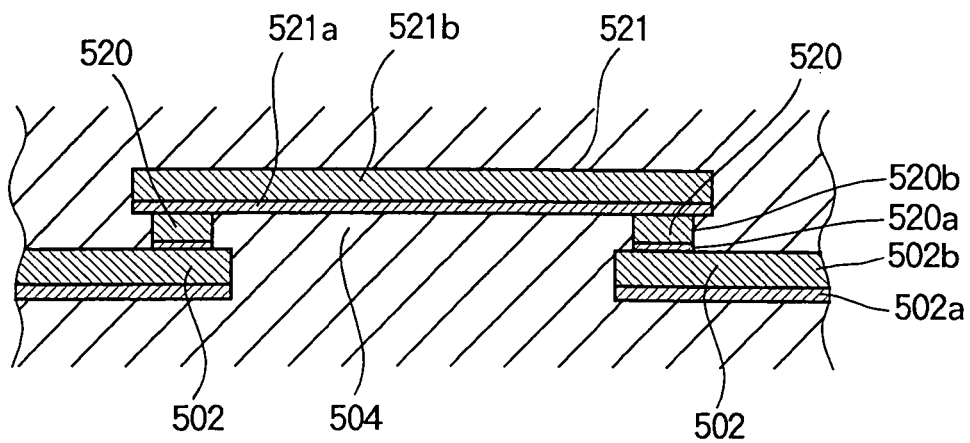
FIG. 10 is a schematic vertical cross-sectional view showing further structure of the inspection pattern in accordance with the fifth embodiment.

Furthermore, as shown in FIG. 10, a contact portion 520 may be made of a metal different from that of the upper-layer wiring portions 521. In FIG. 10, a reference numeral 520a denotes a barrier metal (e.g., TiN) of the contact portion 520 and a reference numeral 520b denotes a main wiring layer (e.g., a tungsten plug) of the contact portion 520. A reference numeral 521a denotes a barrier metal (e.g., TiN) of the upper-layer wiring portions 521, and a reference numeral 521b denotes a main wiring layer (e.g., Al) of the upper-layer wiring portions 521.

Figure 11:
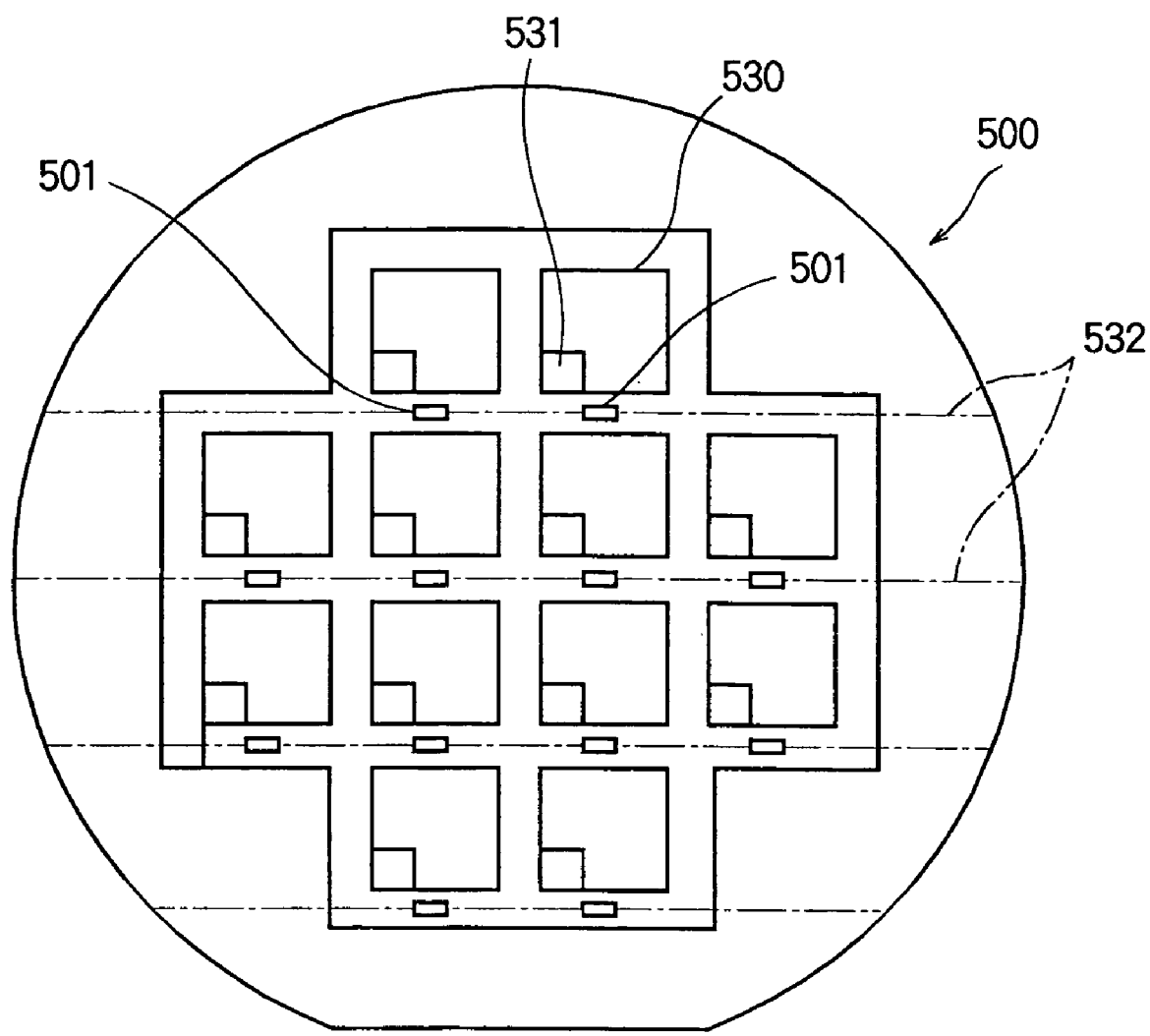
FIG. 11 is a schematic plan view showing an arrangement of the inspection patterns used in the inspection method in accordance with the fifth embodiment.
Figure 12:
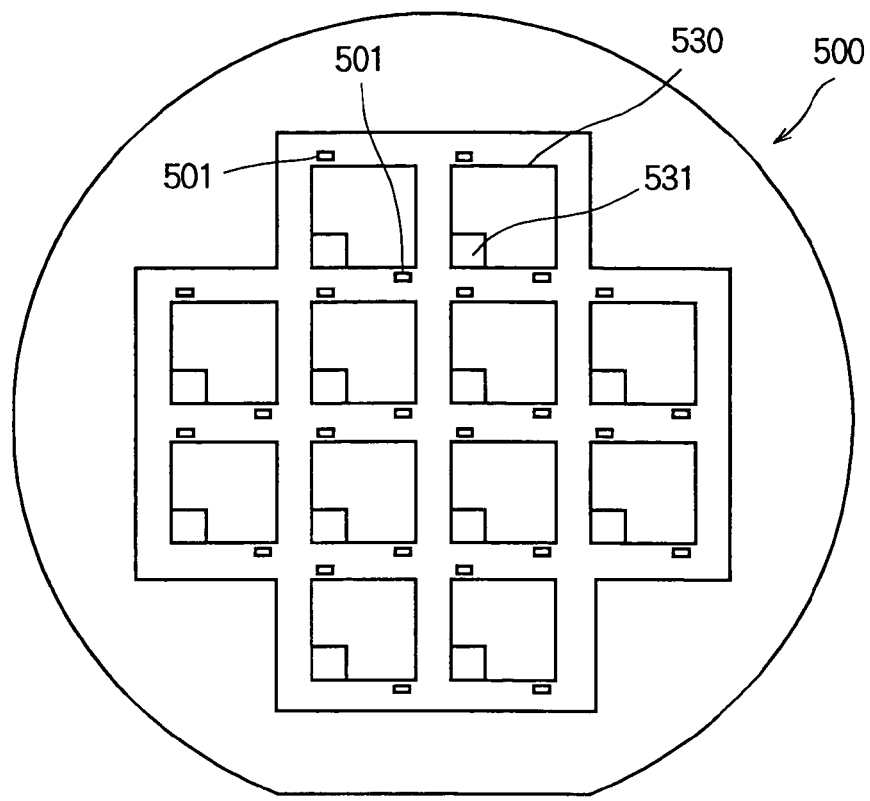
FIG. 12 is a schematic plan view showing another arrangement of the inspection patterns used in the inspection method in accordance with the fifth embodiment.

FIG. 11 is a schematic plan view showing an arrangement of the inspection patterns 501 used in the inspection method in accordance with the fifth embodiment. As shown in FIG. 11, each inspection pattern 501 is formed in a region other than a chip area 530 (e.g., in the vicinity of a grid line 532) of a semiconductor wafer 500 or in a TEG region 531 in the chip area 530 of the semiconductor wafer 500. Further, as shown in FIG. 12, two or more inspection patterns 501 may be provided in the vicinity of a single chip area 530 of the semiconductor wafer 500.

Figure 13:
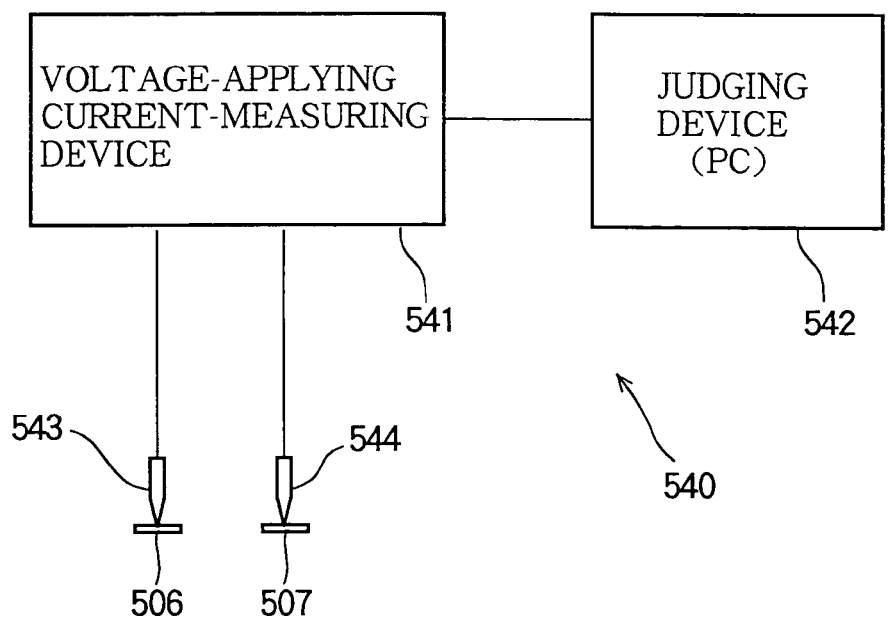
FIG. 13 is a block diagram showing a configuration of an inspection system that implements the inspection method in accordance with the fifth embodiment.

FIG. 13 is a block diagram showing a configuration of an inspection system that implements the inspection method in accordance with the fifth embodiment. As shown in FIG. 13, the inspection system 540 includes a voltage-applying/current-measuring device 541, a judging device 542, and a pair of probes 543 and 544 to be connected to the electrode terminals 506 and 507 of the inspection pattern 501. The voltage-applying/current-measuring device 541 applies a voltage to between a pair of the electrode terminals 506 and 507 of the inspection pattern 501, measures a current flowing through the contact chain of the inspection pattern 501 for a plurality of applied-voltages having different values, and thereby acquires an applied-voltage versus measured-current characteristic of the inspection pattern 510. The judging device 542 compares the applied-voltage versus measured-cur-rent characteristic acquired by the voltage-applying/current-measuring device 541 with a predetermined reference characteristic, and judges presence or absence of a latent defect in the inspection pattern 501 on the basis of the comparison result. The judging device 542 may be provided, for example, in the form of a personal computer (PC). The judging device 542 holds a judgement reference based on judgement reference data to be explained below.

Figure 14:
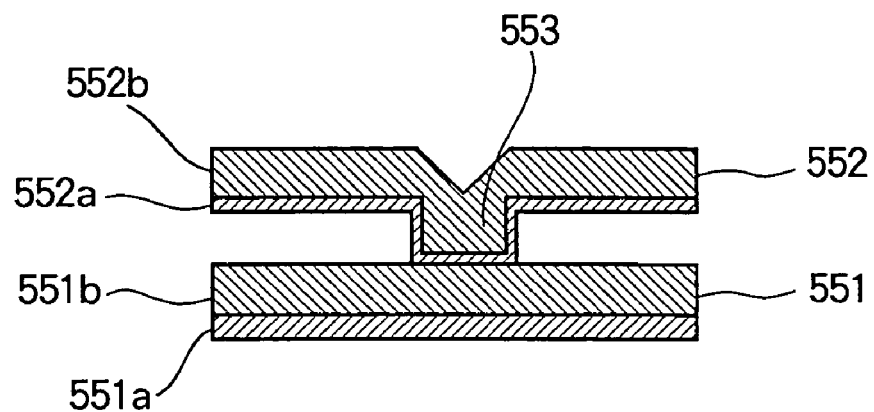
FIG. 14 is a schematic vertical cross-sectional view showing a normal contact portion.

FIG. 14 is a schematic vertical cross-sectional view showing a normal contact portion 553 that electrically connects the lower-layer wiring portions 551 and the upper-layer wiring portions 552. The lower-layer wiring portion 551 includes a barrier metal layer 551a and a main wiring layer 551b. The upper-layer wiring portion 552 includes a barrier metal layer 552a and a main wiring layer 552b. The main wiring layers 551b and 552b are made of Al.

Figure 15:
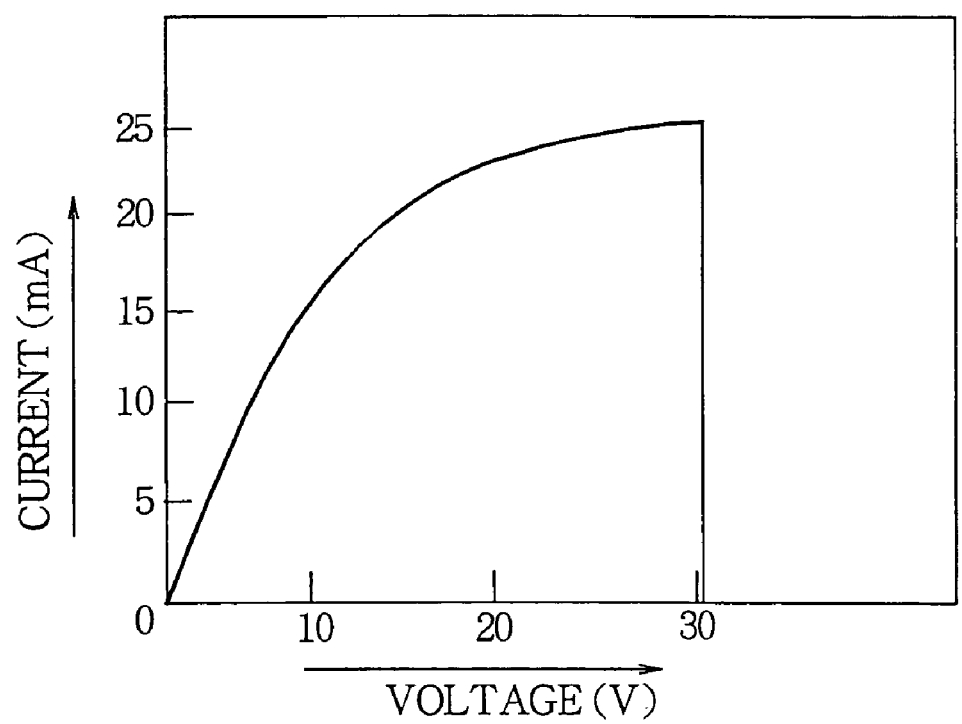
FIG. 15 shows a graph of actually measured data (previously acquired at a preparation stage prior to inspection of the inspection pattern) of a current value when a stepwise increasing voltage is applied to the inspection pattern having the normal contact portion of FIG. 14.

FIG. 15 shows a graph of an actually measured-current value when a stepwise increasing voltage is applied to the normal contact portion 553 in FIG. 14. The current values were obtained by increasing a voltage stepwise in units of 1V (e.g., holding a voltage of 1V for one second, holding a voltage of 2V for one second, holding a voltage of 3V for one second, . . . ), and measuring a current value when each voltage is applied. The fact that the contact portion 553 is normal (i.e., no void and no coverage defect) was confirmed through its observation using a microscope. As a result of tests for many inspection patterns, such an applied-voltage versus measured-current characteristic as shown in FIG. 15 was obtained for the normal contact portion 553.

Figure 16:
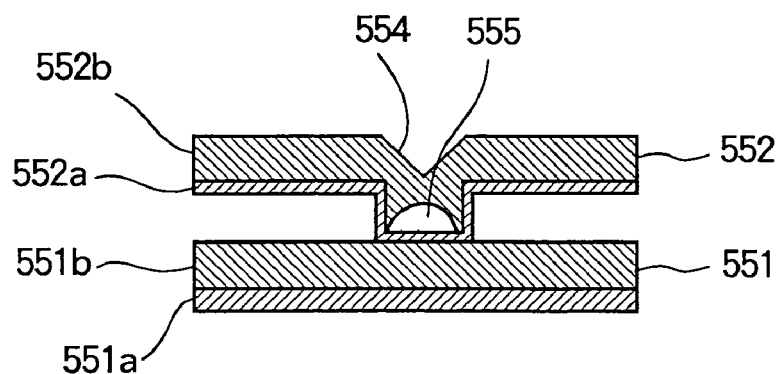
FIG. 16 is a schematic vertical cross-sectional view showing an abnormal contact portion including a void.

FIG. 16 is a schematic vertical cross-sectional view showing an abnormal contact portion 554 having a void 555. The lower-layer wiring portion 551 includes a barrier metal layer 551a and a main wiring layer 551b. The upper-layer wiring portion 552 includes a barrier metal layer 552a and a main wiring layer 552b. The main wiring layers 551b and 552b are made of Al.

Figure 17:
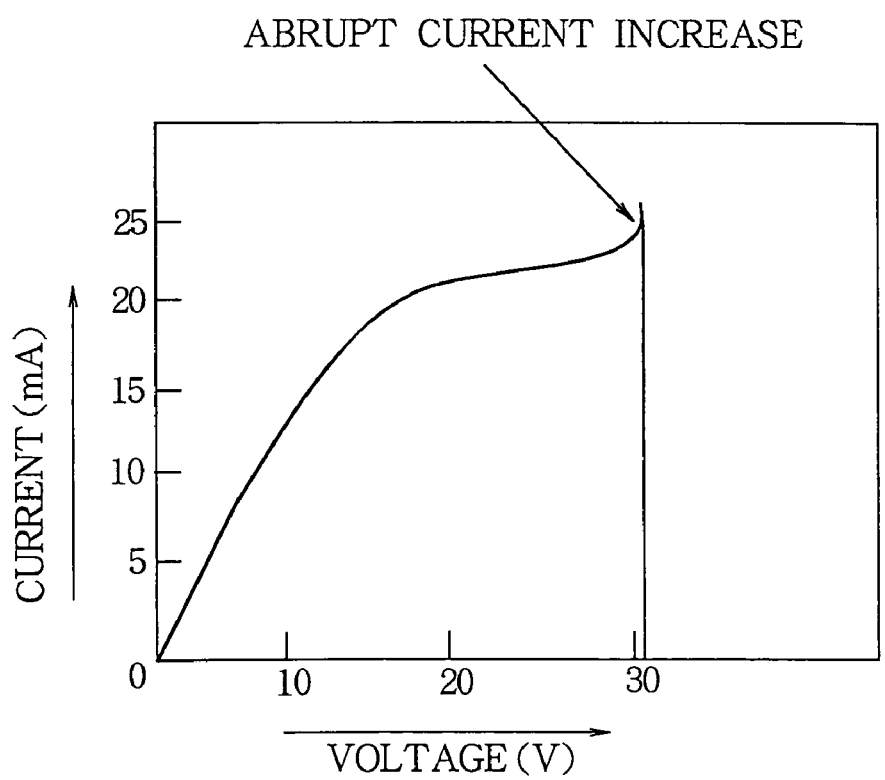
FIG. 17 shows a graph of actually measured data (previously acquired at a preparation stage prior to inspection of the inspection pattern) of a current value when a stepwise increasing voltage is applied to the inspection pattern having the abnormal contact portion of FIG. 16.

FIG. 17 shows a graph of an actually measured-current value when a stepwise increasing voltage is applied to the abnormal contact portion 554 in FIG. 16. How to measure the data for the contact portion of FIG. 17 is the same as how to measure the data for the contact portion of FIG. 15. The fact that the contact portion 554 is abnormal (having the void 555) was confirmed through its observation using a microscope. As a result of tests conducted for many inspection patterns having a void, such a characteristic containing an abrupt current increase immediately before the fusing and breaking as shown in FIG. 17 was obtained as the applied-voltage versus measured-current characteristic of the abnormal contact portion 554 having a void. In this way, the abrupt current increase appears immediately before the fusing and breaking of the contact portion or wiring portion. This is considered to because the metal (e.g., Al) of the upper-layer wiring portion 552 is melted to vanish the void 555 before the fusing and breaking of the contact portion or wiring portion, so that the increase of the effective contact area size of the contact portion causes instantaneous reduction of the resistance value.

Figure 18:
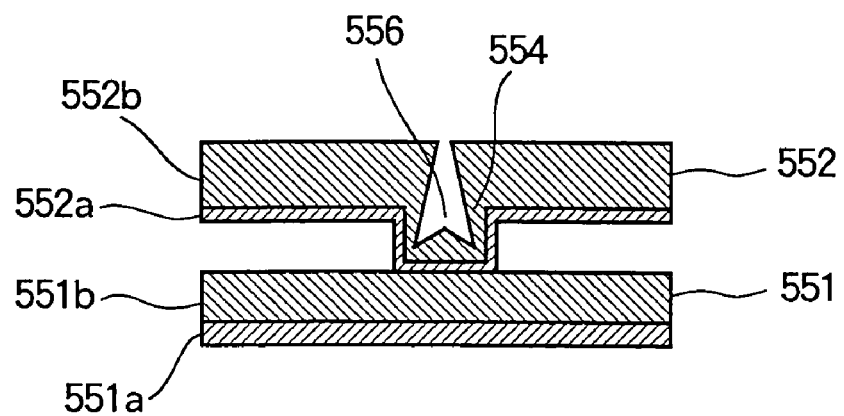
FIG. 18 is a schematic vertical cross-sectional view showing an abnormal contact portion including a part having a degraded coverage.

FIG. 18 is a schematic vertical cross-sectional view showing an abnormal contact portion 554 having a coverage defect 556. The lower-layer wiring portion 551 includes a barrier metal layer 551a and a main wiring layer 551b. The upper-layer wiring portion 552 includes a barrier metal layer 552a and a main wiring layer 552b. The main wiring layers 551b and 552b are made of Al.

Figure 19:
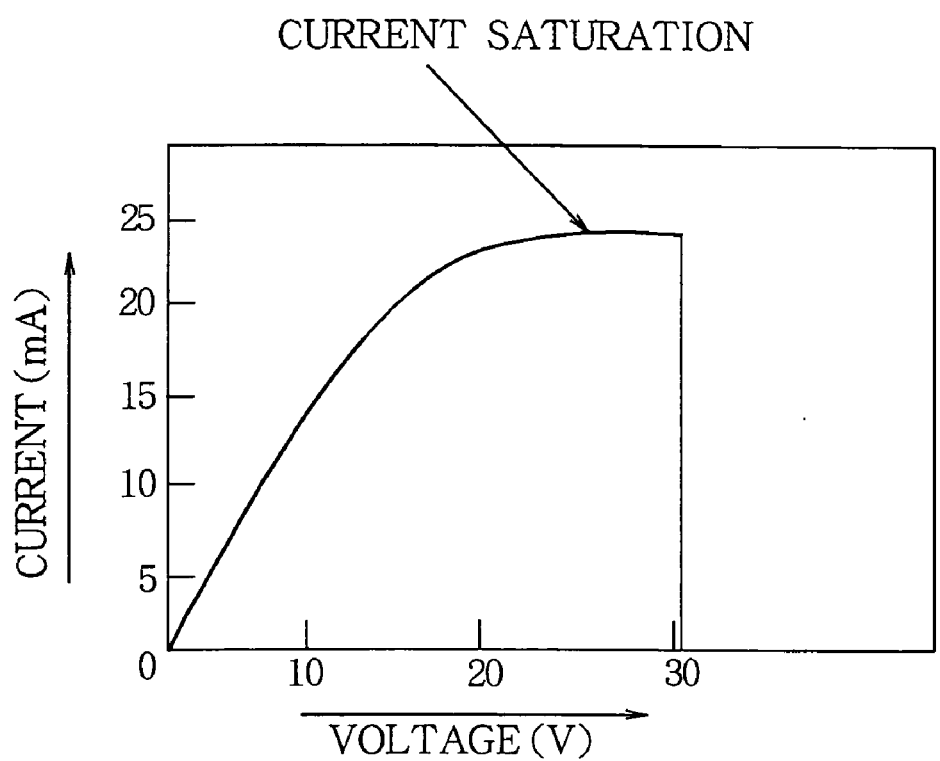
FIG. 19 shows a graph of actually measured data (previously acquired at a preparation stage prior to inspection of the inspection pattern) of a current value when a stepwise increasing voltage is applied to the inspection pattern having the abnormal contact portion of FIG. 18.

FIG. 19 shows a graph of an actually measured-current value when a stepwise increasing voltage is applied to the abnormal contact portion 554 in FIG. 18. How to measure the data for the contact portion of FIG. 19 is the same as how to measure the data for the contact portion of FIG. 15. The fact that the contact portion 554 is abnormal (having the coverage defect 556, i.e., the degraded coverage) was confirmed through its observation using a microscope. As a result of having conducted tests for many abnormal inspection patterns, such a characteristic that current increase is saturated immediately before the fusing and breaking of the contact portion or wiring portion was obtained as shown in FIG. 19, as the applied-voltage versus measured-current characteristic of the abnormal contact portion 554 having a coverage defect. In this way, the current increase is saturated immediately before the fusing and breaking of the contact portion or wiring portion. This is considered to be because the metal of the upper-layer wiring portion melts before the fusing and breaking of the contact portion or wiring portion to cause appearance of a part without the main wiring layer (i.e., a part made of only the barrier metal layer 552b), such a period of a current is present as to flow with only the barrier metal layer having a large resistance value, and thereafter the generation of Joule heat of the barrier metal layer having a high melting point is promoted, leading to the fusing and breaking of the contact portion or wiring portion.

Figure 20:
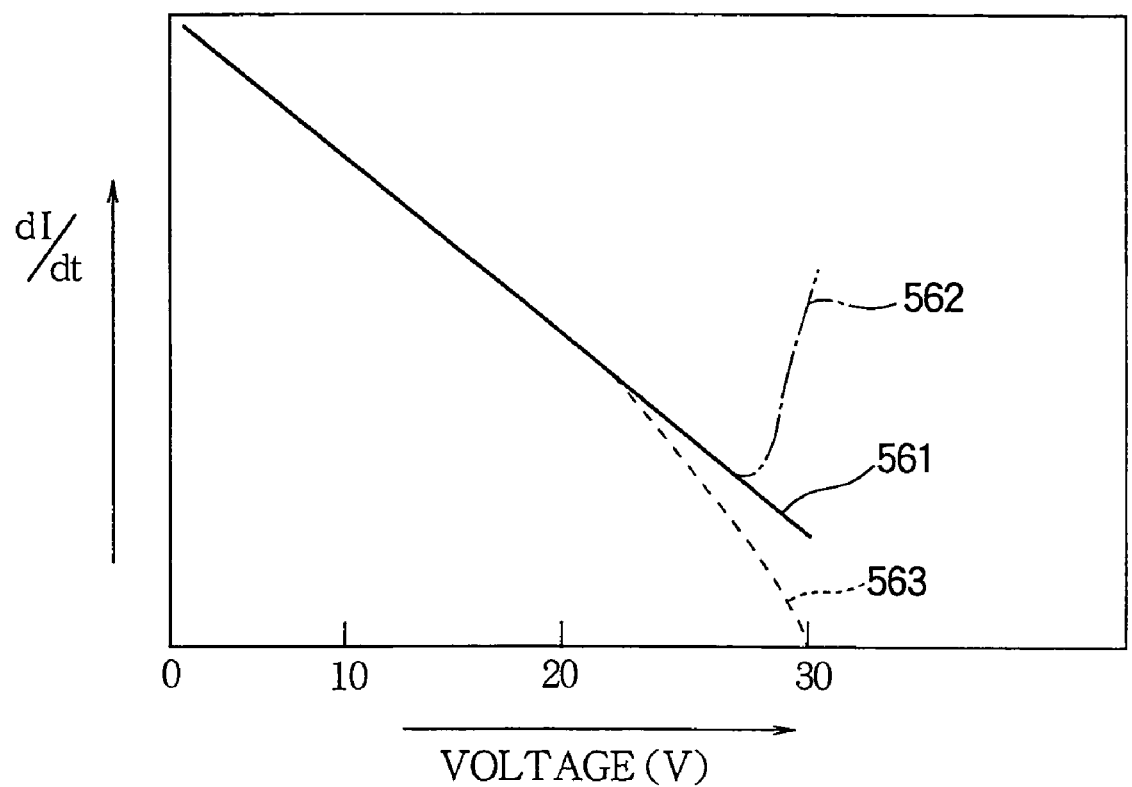
FIG. 20 shows graphs of a differential value of the actually-measured current values of FIGS. 15, 17 and 19.

FIG. 20 shows graphs of differential values dI/dt of the actually measured-current values in FIGS. 15, 17 and 19. In FIG. 20, a curve 561 shows dI/dt of the normal contact portion in FIG. 15, a curve 562 shows dI/dt of the contact portion having a void in FIG. 17, and a curve 563 shows dI/dt of the contact portion having a coverage defect in FIG. 19.

The data measured by the procedures already explained referring to FIGS. 14 through 20 or reference values based on the measured data are previously held in the judging device 542 of the inspection system 540 shown in FIG. 13.

An explanation will next be made as to an inspection method for detection of a latent defect in a multi-layer wiring structure formed on a semiconductor wafer. The inspection of a semiconductor device is carried out using the inspection system 540 shown in FIG. 13 with respect to the inspection pattern 501 formed in the semiconductor device. First of all, a voltage is applied to between a pair of electrode terminals 506 and 507 of the inspection pattern 501, a current flowing through a contact chain of the inspection pattern 501 is measured for a plurality of applied-voltages having different values, whereby an applied-voltage versus measured-current characteristic for the inspection pattern 501 is acquired. In this case, the applied-voltage is such a stepwise increasing voltage as to be increased by a predetermined voltage ΔV (e.g., a voltage of 1 V) each time a predetermined time Δt (e.g., one second) elapses. In this case, the predetermined time Δt is not limited to one second and the predetermined voltage ΔV is not limited to a voltage of 1V. Further, the applied-voltage may also be a linearly increasing voltage that is increased with passage of time.

Next, the judging device 542 compares the applied-voltage versus measured-current characteristic of the inspection pattern 501 with a predetermined reference characteristic to thereby judge presence or absence of a latent defect in the inspection pattern 501. The judgement is made based on, for example, the gradient of a characteristic curve relating to the applied-voltage versus measured-current characteristic depicted in a rectangular coordinate system with an abscissa of an applied-voltage and an ordinate of a measured-current.

More concretely, when the gradient of a characteristic curve relating to the applied-voltage versus measured-current characteristic immediately before the inspection pattern 501 is fused and broken is not larger than a predetermined reference value (e.g., a reference value determined based on the gradient of the characteristic curve of FIG. 17 immediately before the fusing and breaking), the inspection system 540 judges that no void is present in any of the contact portions of the inspection pattern 501. Otherwise, the inspection system 540 judges that a void is present in any of the contact portions of the inspection pattern 501. Further, when the gradient of the characteristic curve relating to the applied-voltage versus measured-current characteristic immediately before the inspection pattern 501 is fused and broken is not smaller than a predetermined reference value (e.g., a reference value determined based on the gradient of the characteristic curve of FIG. 19 immediately before the fusing and breaking), the inspection system 540 judges that no coverage defect is present in any of the contact portions of the inspection pattern. Otherwise, the inspection system 540 judges that a coverage defect is present in any of the contact portions of the inspection pattern 501.

As another alternative, when an abrupt increase is recognized immediately before the inspection pattern 501 is fused and broken in the characteristic curve (e.g., the curve 562 in FIG. 20) of the current differential value characteristic as shown in FIG. 20, the inspection system 540 can judge that a void is present in any of the contact portions of the inspection pattern 501. Further, when the gradient of the characteristic curve relating to the current differential value characteristic immediately before the inspection pattern 501 is fused and broken is not larger than a predetermined reference value (e.g., a reference value determined based on the gradient of the curve 563 in FIG. 20), the inspection system 540 can judge that a coverage defect is present in any of the contact portions of the inspection pattern 501.

As has been explained above, in accordance with the inspection method in accordance with the fifth embodiment, such a latent defect in the inspection pattern 501 can be detected that could not be detected in the conventional probing test. When a latent defect was detected by the inspection method in the inspection pattern 501, there is a high possibility that a latent defect must be present also in the multi-layer wiring structure of a chip area formed by a process common to a process for forming the inspection pattern. For this reason, when the inspection method in accordance with the fifth embodiment is employed, such a semiconductor device that has been judged as not abnormal in the conventional probing test and been put on the marketplace, can be avoided from being put on the marketplace, and thereby the product reliability can be increased.

Sixth Embodiment

Figure 21:
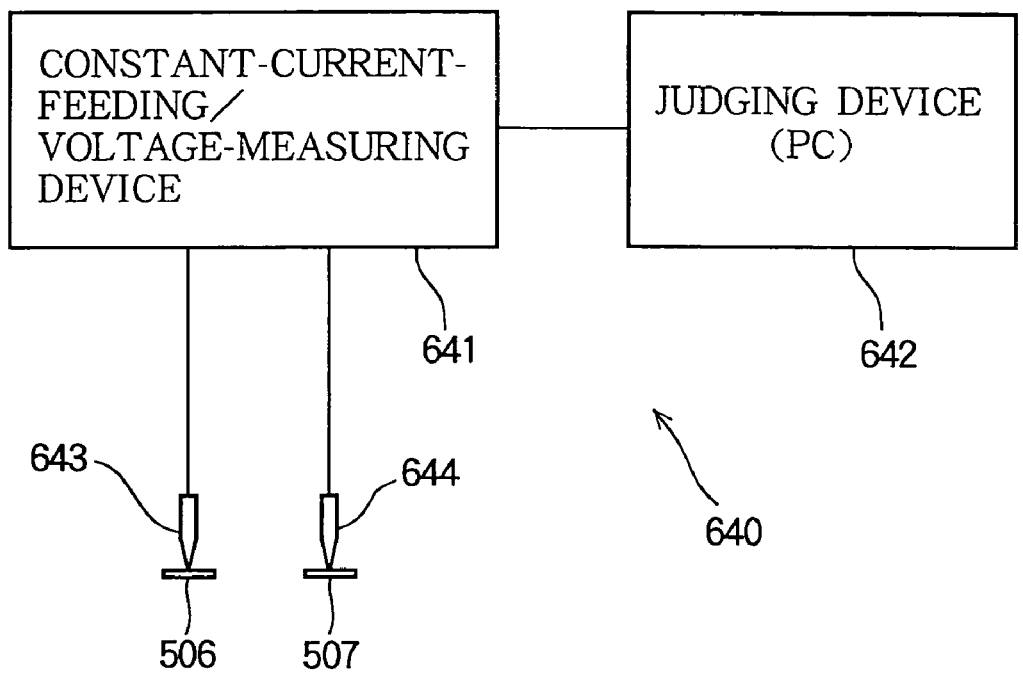
FIG. 21 is a block diagram showing a configuration of an inspection system that implements an inspection method in accordance with a sixth embodiment of the present invention.

FIG. 21 is a block diagram showing a configuration of an inspection system 640 that implements an inspection method in accordance with the sixth embodiment of the present invention. As shown in FIG. 21, the inspection system 640 includes a constant-current-feeding/voltage-measuring device 641, a judging device 642, and a pair of probes 643 and 644 to be connected to the electrode terminals 506 and 507 of the inspection pattern 501. The constant-current-feeding/voltage-measuring device 641 acquires an elapsed-time versus measured-voltage characteristic of the inspection pattern 501 by passing a constant current through a pair of the electrode terminals 506 and 507 of the inspection pattern 510 and measuring a voltage developed between both ends (i.e., the electrode terminals 506 and 507) of the contact chain of the inspection pattern 510. The judging device 542 judges presence or absence of a latent defect in the inspection pattern 501 by comparing the elapsed-time versus measured-voltage characteristic acquired by the constant-current-feeding/voltage-measuring device 641 with a predetermined reference characteristic. The judging device 642 can be provided, for example, in the form of a personal computer (PC). Further, the judging device 642 holds reference values based on judgement reference data to be explained later.

Figure 22:
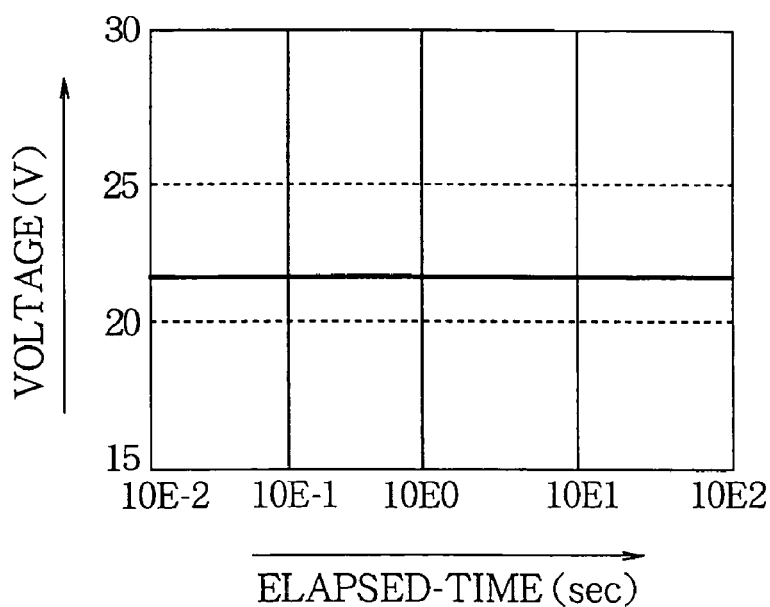
FIG. 22 shows a graph of actually measured data (previously acquired at a preparation stage prior to inspection of the inspection pattern) of a voltage value when a constant current is applied to the normal contact portion of FIG. 14.

FIG. 22 shows a graph of actually measured data (previously acquired at a preparation stage prior to inspection of the inspection pattern) of a voltage value when a constant current is made to flow through the normal contact portion 553 in FIG. 14. The value of the constant current corresponds to 90% of the current value at the time of the fusing and breaking of the contact portion or wiring portion shown in FIG. 15. In this case, the current value may be set at another value determined in a range of 70% through 99% of the current value at the time of the fusing and breaking of the contact portion or wiring portion shown in FIG. 15. The fact that the contact portion 553 is normal (i.e., has no void and no coverage defect) was confirmed through its observation using a microscope. As a result of having conducted tests for many inspection patterns, an elapsed-time versus measured-voltage characteristic of the normal contact portion 553 is a constant voltage value as shown in FIG. 22.

Figure 23:
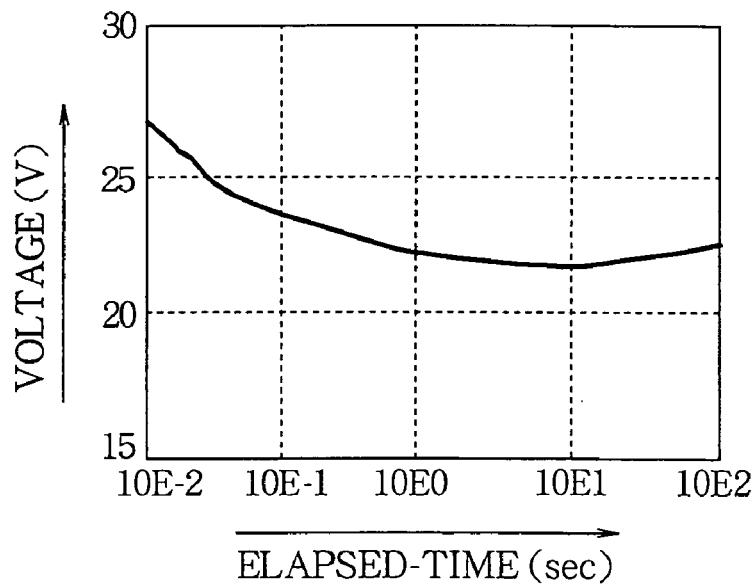
FIG. 23 shows a graph of actually measured data (previously acquired at a preparation stage prior to inspection of the inspection pattern) of a voltage value when a constant current is applied to the abnormal contact portion of FIG. 16.

FIG. 23 shows a graph of actually measured data (previously acquired at a preparation stage prior to inspection of the inspection pattern) of a voltage value when a constant current is made to flow through the abnormal contact portion 554 in FIG. 16. A method for measuring the data is the same as the method for measuring the data in FIG. 22. The fact that the contact portion 554 is abnormal (has a void 555) was confirmed through its observation using a microscope. As a result of having tested many inspection patterns having a void, an elapsed-time versus measured-voltage characteristic of the abnormal contact portion 554 was a voltage variation which largely drops with passage of time as shown in FIG. 23. The reason of the voltage drop is considered to be because, as the void becomes gradually small due to the melting of the main wiring layer 552b, the resistance value of the contact portion is reduced, which leads to reduction of the voltage.

Figure 24:
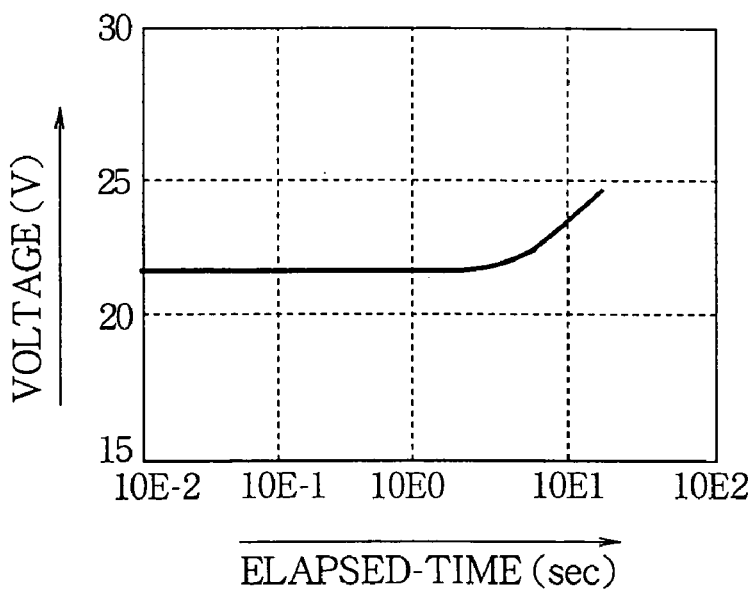
FIG. 24 shows a graph of actually measured data (previously acquired at a preparation stage prior to inspection of the inspection pattern) of a voltage value when a constant current is applied to the abnormal contact portion of FIG. 18.

FIG. 24 shows a graph of actually measured data (previously acquired at a preparation stage prior to inspection of the inspection pattern) of a voltage value when a constant current is made to flow through the abnormal contact portion 554 in FIG. 18. A method for measuring the data is the same as the method for measuring data in FIG. 15. The fact that the contact portion 554 is abnormal (has a coverage defect 556) was confirmed through its observation using a microscope. As a result of having tested many inspection patterns having an abnormality, an elapsed-time versus measured-voltage characteristic for the abnormal contact portion 554 having a coverage defect increases immediately before the fusing and breaking of the contact portion or wiring portion as shown in FIG. 24. In this way, the voltage increase takes place immediately before the fusing and breaking of the contact portion or wiring portion. This is considered to be because the main wiring layer (made of, e.g., Al) as the upper-layer wiring portion is melted immediately before the fusing and breaking of the contact portion or wiring portion to cause appearance of a part without the main wiring layer 552b (i.e., a part made of only the barrier metal layer 552a), and there is a current period during which the connection is done only with the high-resistance barrier metal layer 552a.

The data measured by the method explained in connection with FIGS. 22 through 24 and reference values based on the data are previously held in the judging device 642 of the inspection system 640 of FIG. 21.

An explanation will next be made as to an inspection method for detecting a latent defect in a multi-layer wiring structure formed on a semiconductor wafer. The inspection of a semiconductor device is carried out using the inspection system 640 shown in FIG. 21 and the inspection pattern 501 formed in the semiconductor device. First of all, a predetermined current is made to flow between a pair of electrode terminals 506 and 507 of the inspection pattern 501, a time change in a voltage developed between the pair of electrode terminals 506 and 507 is measured to thereby acquire an elapsed-time versus measured-voltage characteristic for the inspection pattern 501. The value of a constant current corresponds to 90% of the current value at the time of the fusing and breaking of the contact portion or wiring portion shown in FIG. 15. In this connection, the current value may be set at another value determined in a range of 70% through 99% of the current value at the time of the fusing and breaking of the contact portion or wiring portion.

Presence or absence of a latent defect in the inspection pattern 501 is judged on the basis of the elapsed-time versus measured-voltage characteristic of the inspection pattern 501. The judgement is carried out on the basis of the value of the measured-voltage varied with passage of time.

More specifically, when a decrease in the varied value of the measured-voltage with passage of time is not larger than a predetermined value, it is judged that no void is present in any of the contact portions of the inspection pattern 501. Otherwise, it is judged that a void is present in any of the contact portions of the inspection pattern 501.

Further, when an increase in the varied value of the measured-voltage with passage of time is not larger than a predetermined value, it is judged that no coverage defect is present in any of the contact portions of the inspection pattern 501. Otherwise, it is judged that a coverage defect is present in any of the contact portions of the inspection pattern 501.

As has been explained above, in accordance with the inspection method in accordance with the sixth embodiment, a latent defect of the inspection pattern 501, which was not able to be detected by the conventional probing test, can be detected. When a latent defect was detected in the inspection pattern 501 by the inspection method, there is a high possibility that a latent defect must be present even in the multi-layer wiring structure of a chip area formed by a process common to a process for forming the inspection pattern. For this reason, when the inspection method in accordance with the sixth embodiment is employed, a semiconductor device possibly having a latent defect, which has been judged as normal in the conventional probing test and has been put on the marketplace, can be avoided from being put on the marketplace, and product reliability can be increased.

Seventh Embodiment

Figure 25:
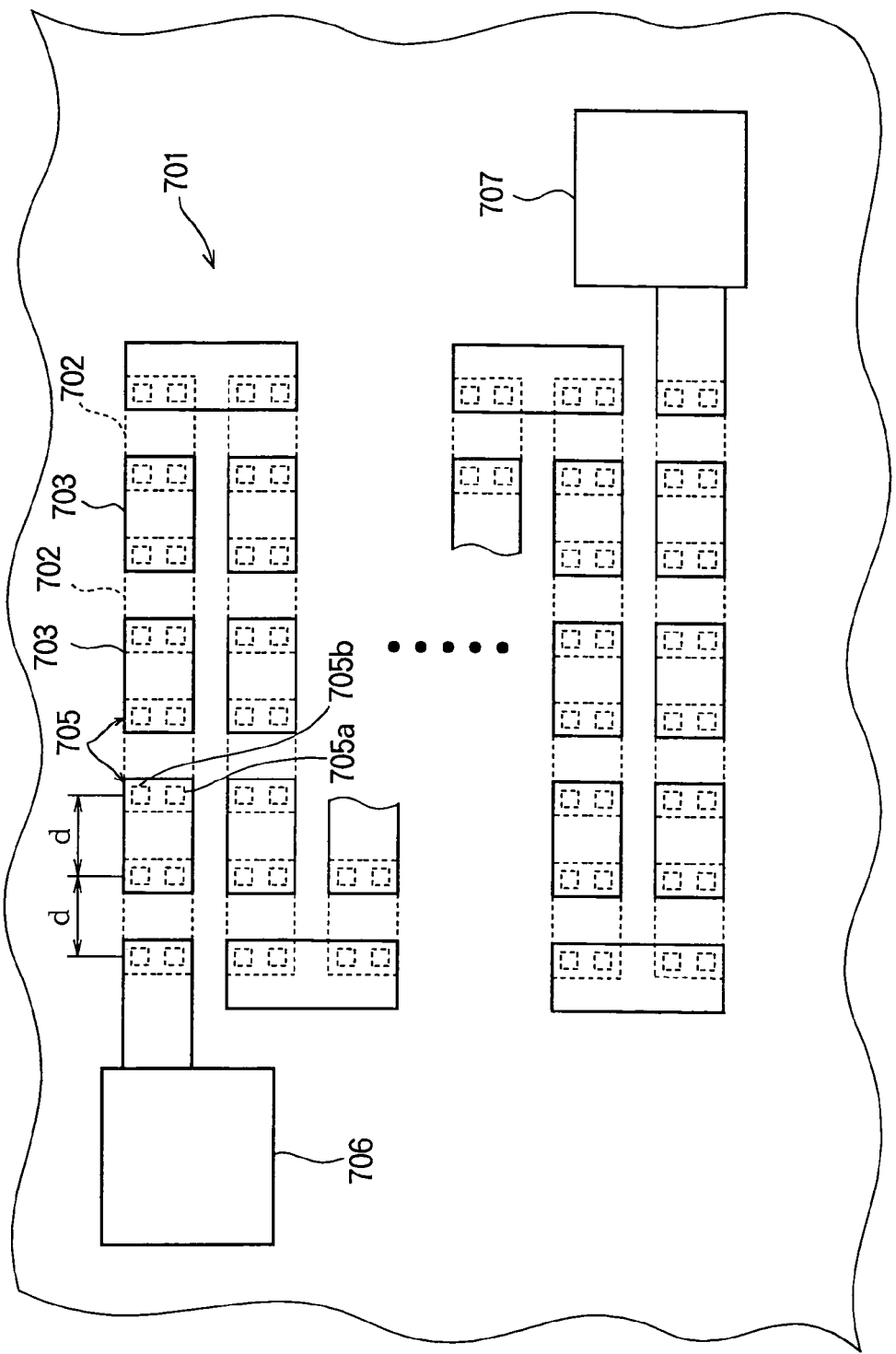
FIG. 25 is a schematic plan view, with certain part omitted, showing an inspection pattern used in an inspection method in accordance with a seventh embodiment of the present invention.

FIG. 25 is a schematic plan view, with certain part omitted, showing an inspection pattern for use in an inspection method in accordance with the seventh embodiment of the present invention. As shown in FIG. 25, an inspection pattern 701 includes a plurality of lower-layer wiring portions 702 arranged so as to be spaced at a distance, a plurality of upper-layer wiring portions 703 arranged so as to be spaced at a distance, and an insulating layer provided between the plurality of lower-layer wiring portions 702 and the plurality of upper-layer wiring portions 703. The inspection pattern 701 also includes a plurality of contact units 705 which electrically connects the plurality of lower-layer wiring portions 702 and the plurality of upper-layer wiring portions 703 so as to form a contact chain including the plurality of lower-layer wiring portions 702 and the plurality of upper-layer wiring portions 703 alternately connected in series. The inspection pattern 701 further includes a pair of electrode terminals 706 and 707, wherein the electrode terminal 706 is electrically connected to one end of the contact chain, and the electrode terminal 707 is electrically connected to the other end of the contact chain.

In the seventh embodiment, each of the contact units 705 has two contact portions 705a and 705b formed in two contact holes arranged side by side. Most of the two contact portions 705a and 705b are arranged in the width direction of the upper and lower-wiring portions 703 and 702. Further, in FIG. 25, the central part of the contact chain is omitted. The plan view shape of the contact chain is not limited to the illustrated shape shown in FIG. 25. In the seventh embodiment, the arrangement other than the above respects is the same as that in the foregoing fifth or sixth embodiment.

As has been explained above, according to the inspection method in accordance with the seventh embodiment, a latent defect in the inspection pattern 701, which has not been detected in the conventional probing test, can be detected. When a latent defect was detected in the inspection pattern 701 by this inspection method, there is a high possibility that a latent defect is present even in the multi-layer wiring structure of a chip area formed through a process common to a process for forming the inspection pattern. For this reason, when the inspection method in accordance with the seventh embodiment is employed, a semiconductor device possibly having a latent defect, which has been judged as not abnormal by the conventional probing test and has been put on the marketplace, can be avoided from being put on the marketplace, and product reliability can be increased.

Further, the entire resistance of the inspection pattern 701 of the seventh embodiment can be made lower than that of the fifth or sixth embodiment, the number of contact holes can be increased twice, a defect presence probability can be increased, and thus the detection sensitivity of a latent defect can be increased.

Eighth Embodiment

Figure 26:
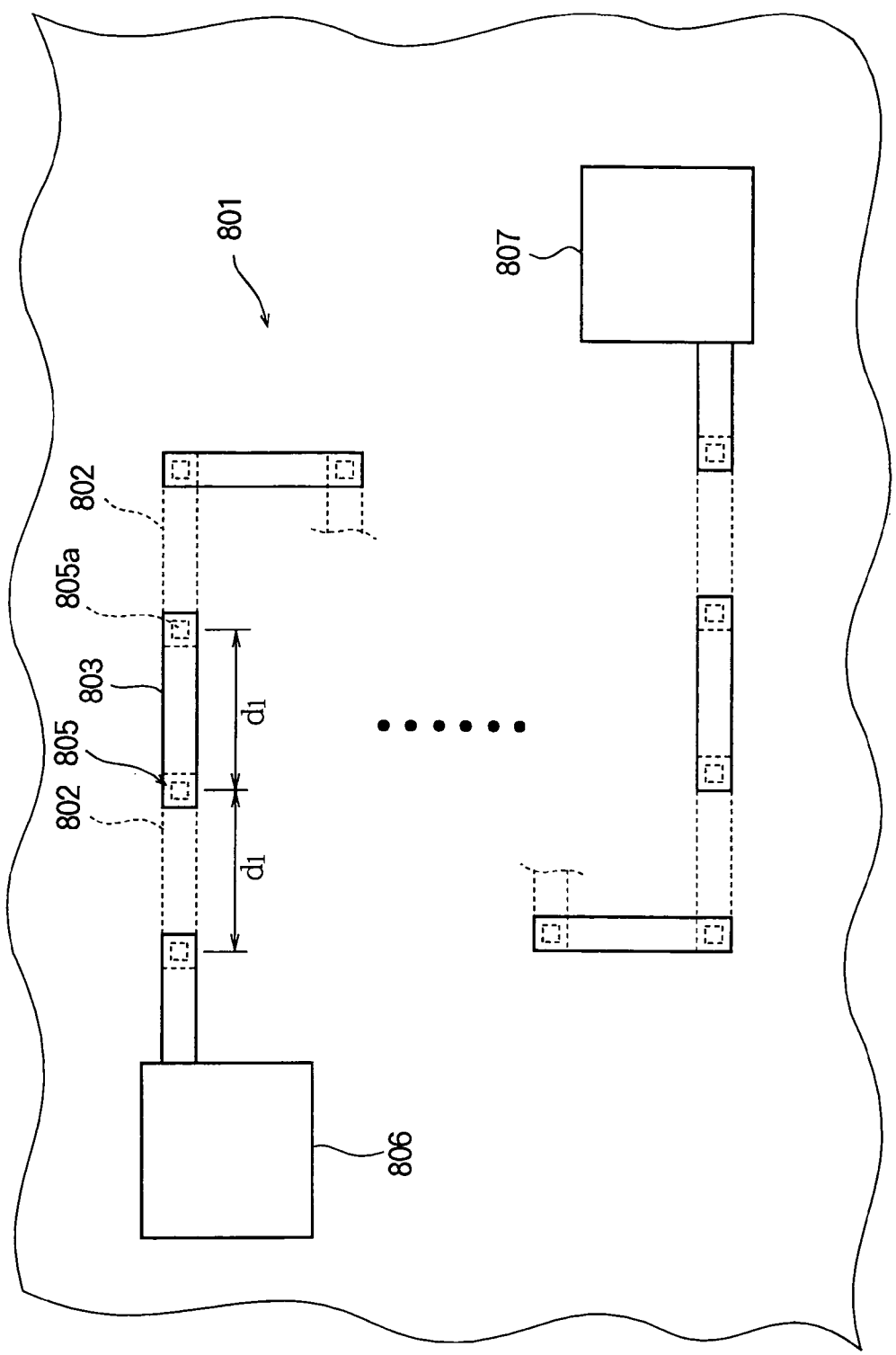
FIG. 26 is a schematic plan view, with certain part omitted, showing an inspection pattern used in an inspection method in accordance with an eighth embodiment of the present invention.

FIG. 26 is a schematic plan view, with certain part omitted, showing an inspection pattern used in an inspection method in accordance with the eighth embodiment of the present invention. As shown in FIG. 26, an inspection pattern 801 includes a plurality of lower-layer wiring portions 802 arranged so as to be spaced at a distance, a plurality of upper-layer wiring portions 803 arranged so as to be spaced at a distance, and an insulating layer provided between the plurality of lower-layer wiring portions 802 and the plurality of upper-layer wiring portions 803. The inspection pattern 801 also includes a plurality of contact units 805 which electrically connects the plurality of lower-layer wiring portions 802 and the plurality of upper-layer wiring portions 803 so as to form a contact chain including the plurality of lower-layer wiring portions 802 and the plurality of upper-layer wiring portions 803 alternately connected in series. The inspection pattern 801 further includes a pair of electrode terminals 806 and 807, wherein the electrode terminal 806 is electrically connected to one end of the contact chain, and the electrode terminal 807 is electrically connected to the other end of the contact chain.

In the eighth embodiment, each of the contact units 805 has a single contact portion 805a formed in a single contact hole. Further, in FIG. 26, the central part of the contact chain is omitted. The plan view shape of the contact chain is not limited to the illustrated shape in FIG. 26.

In the eighth embodiment, a length of each lower-layer wiring portion 802, a length of each upper-layer wiring portion 803, and a position of each contact unit 805 are set in such a way that an interval "d1" between ones (that is, between central positions of the contact units 805) of the plurality of contact units 805 adjacent to each other in a longitudinal direction of the lower-layer wiring portions 802 or the upper-layer wiring portions 803 is longer than 50 µm. In the eighth embodiment, the arrangement other than the above respects is the same as that of the foregoing fifth or sixth embodiment.

Since the interval "d1" is set at a value longer than 50 µm, when a current is made to flow through the inspection pattern 801, atoms (e.g., Al) in the material of the main wiring layer are moved by the electromigration effect. When the contact portion 805a of the upper-layer wiring portions 803 has an Al coverage defect, the movement of atoms resulting from the electromigration effect from the bad coverage part is accelerated and the Al disappearance is accelerated upstream of an electron flow. As a result, the Joule heat of the barrier metal made of a high melting point metal is promoted, leading to the fusing and breaking of the contact portion or wiring portion. Accordingly, when compared with the inspection patterns of the first through seventh embodiments having a contact unit interval "d" of no longer than 50 µm, not only the Joule heat generation but also the electromigration phenomenon is added, so that a latent defect can be made notable more fast and thus a test time can be shortened.

As described above, according to the inspection method in accordance with the eighth embodiment, a latent defect in the inspection pattern 801, which has not been able to be detected by the conventional probing test, can be detected. When a latent defect was detected in the inspection pattern 801 by the aforementioned inspection method, there is a high possibility that a latent defect is present even in the multi-layer wiring structure of a chip area formed through a process common to a process for forming the inspection pattern 801. For this reason, when the inspection method in accordance with the eighth embodiment is employed, a semiconductor device, which has been judged as not abnormal in the conventional probing test and been put on the marketplace, can be avoided from being put on the marketplace, and thus product reliability can be increased.

Ninth Embodiment

Figure 27:
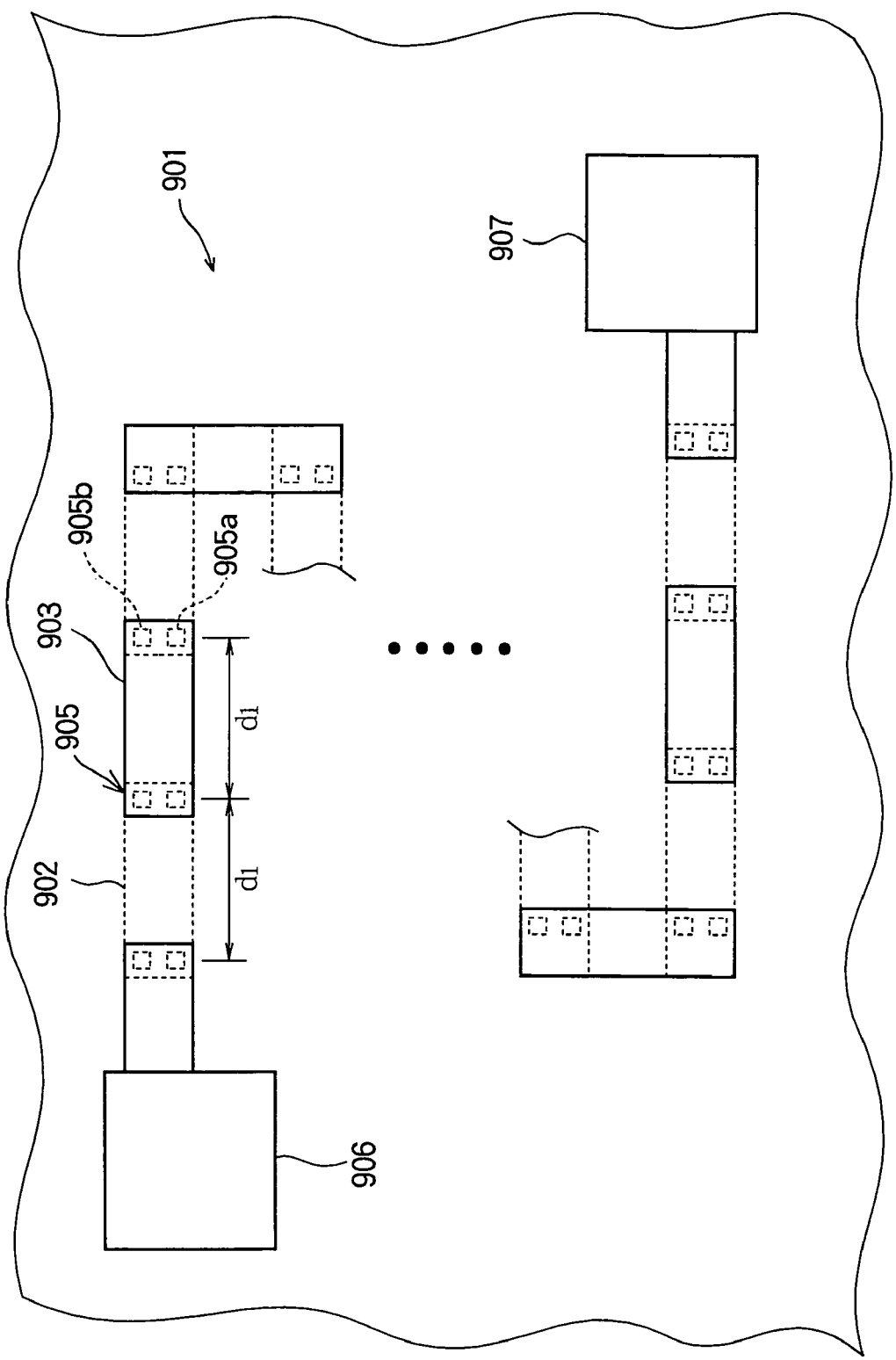
FIG. 27 is a schematic plan view, with certain part omitted, showing an inspection pattern used in an inspection method in accordance with a ninth embodiment of the present invention.
Figure 28:
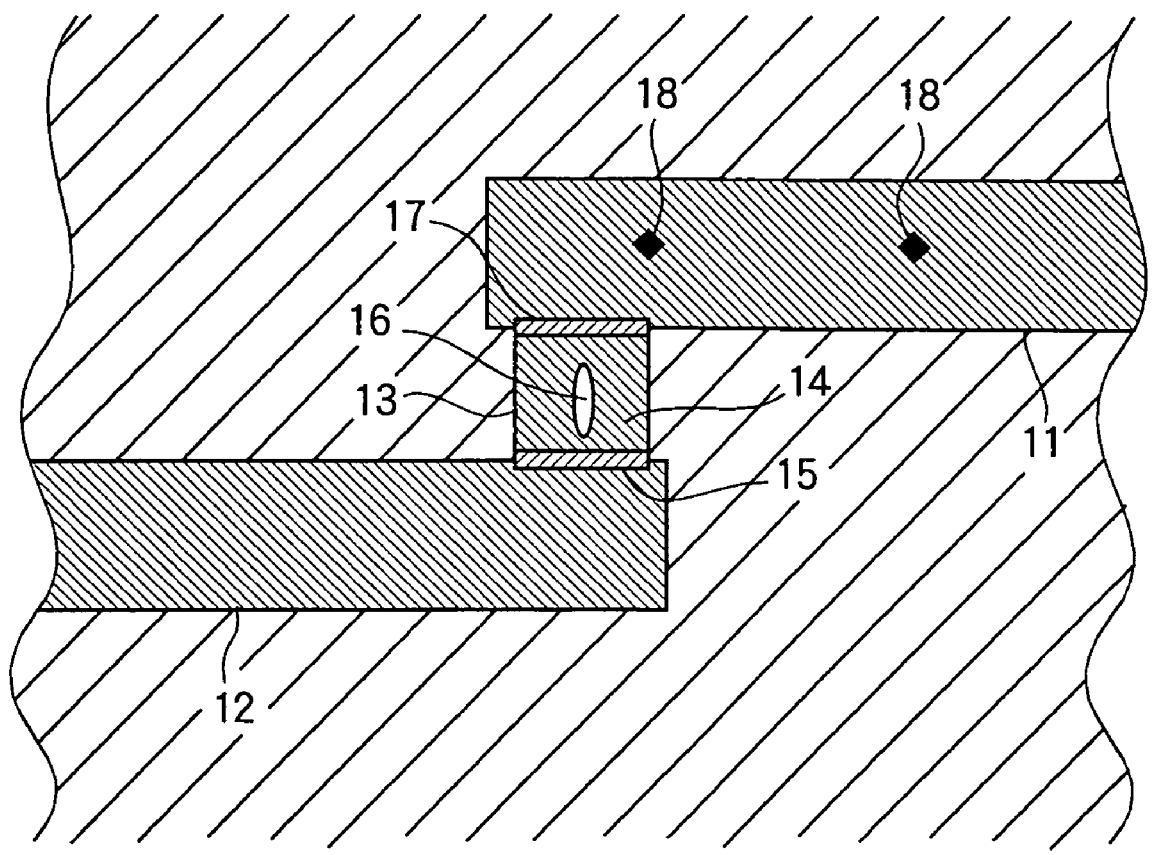
FIG. 28 a schematic vertical cross-sectional view showing a conventional multi-layer wiring structure of a semiconductor device.

FIG. 27 is a schematic plan view, with certain part omitted, showing an inspection pattern 901 for use in an inspection method in accordance with the ninth embodiment of the present invention. As shown in FIG. 27, the inspection pattern 901 includes a plurality of lower-layer wiring portions 902 arranged so as to be spaced at a distance, a plurality of upper-layer wiring portions 903 arranged so as to be spaced at a distance, and an insulating layer provided between the plurality of lower-layer wiring portions 902 and the plurality of upper-layer wiring portions 903. The inspection pattern 901 also includes a plurality of contact units 905 which electrically connects the plurality of lower-layer wiring portions 902 and the plurality of upper-layer wiring portions 903 so as to form a contact chain including the plurality of lower-layer wiring portions 902 and the plurality of upper-layer wiring portions 903 alternately connected in series. The inspection pattern 901 further includes a pair of electrode terminals 906 and 907, wherein the electrode terminal 906 is electrically connected to one end of the contact chain, and the electrode terminal 907 is electrically connected to the other end of the contact chain.

In the ninth embodiment, each of the contact units 905 has two contact portions 905a and 905b formed in two contact holes arranged side by side. Most of the two contact portions 905a and 905b are arranged in the width direction of the upper and lower-wiring portions 903 and 902. Further, in FIG. 27, the central part of the contact chain is omitted. The plan view shape of the contact chain is not limited to the illustrated shape shown in FIG. 27.

In the ninth embodiment, a length of each lower-layer wiring portion 902, a length of each upper-layer wiring portion 903, and a position of each contact unit 905 are set in such a way that an interval "d1" between ones (that is, between central positions of the contact units 905) of the plurality of contact units 905 adjacent to each other in a longitudinal direction of the lower-layer wiring portions 902 or the upper-layer wiring portions 903 is longer than 50 µm. In the ninth embodiment, the arrangement other than the above respects is the same as that of the foregoing fifth or sixth embodiment.

Since the interval "d1" is set at a value longer than 50 µm, when a current is made to flow through the inspection pattern 901, atoms (e.g., Al) in the material of the main wiring layer are moved by the electromigration effect. When the contact portion 905a of the upper-layer wiring portions 903 has an Al coverage defect, the movement of atoms resulting from the electromigration effect from the bad coverage part is accelerated and the Al disappearance is accelerated upstream of an electron flow. As a result, the Joule heat of the barrier metal made of a high melting point metal is promoted, leading to the fusing and breaking of the contact portion or wiring portion. Accordingly, when compared with the inspection patterns of the first through seventh embodiments having a contact unit interval "d" of no longer than 50 µm, not only the Joule heat generation but also the electromigration phenomenon is added, so that a latent defect can be made notable more fast and thus a test time can be shortened.

According to the inspection method in accordance with the ninth embodiment, a latent defect in the inspection pattern 901, which has not been able to be detected by the conventional probing test, can be detected. When a latent defect was detected in the inspection pattern 901 by this inspection method, there is a high possibility that a latent defect is present even in the multi-layer wiring structure of a chip area formed through a process common to a process for forming the inspection pattern 901. For this reason, when the inspection method in accordance with the ninth embodiment is employed, a semiconductor device, which has been judged as not abnormal in the conventional probing test and been put on the marketplace, can be avoided from being put on the marketplace, and thus product reliability can be increased.

Further, since the entire resistance of the inspection pattern 901 of the ninth embodiment can be made lower than that of the eighth embodiment and the number of the contact holes can be increased twice, the probability of presence of a defect can be increased and thus the detection sensitivity of a latent defect can be increased.

Although, in the foregoing first through ninth embodiments, the explanation has been made in connection with the examples using the two-layer wiring portions, the present invention can be also applied to the three or more-layer wiring portions.

In the foregoing fifth through ninth embodiments, explanation has been made in connection with the examples having a single contact hole or two contact holes aligned in the width direction of the wiring portion. However, the number of contact holes aligned in the width direction of the wiring portion may be three or more. Further, the number of contact holes aligned in the longitudinal direction of the wiring portion may be two or more.

The inspection methods in accordance with the fifth through ninth embodiments may be applied to the inspection pattern and the auxiliary pattern of the first through fourth embodiments.

Further, using an auxiliary pattern similar to that of any of the first through fourth embodiments, the degree of a defect in the inspection patterns of the fifth through ninth embodiments can be estimated.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. An inspection method of a semiconductor device,
    wherein the semiconductor device includes a multi-layer wiring structure, and an inspection pattern for detection of a latent defect of the multi-layer wiring structure; and
    wherein the inspection pattern includes:
    a plurality of lower-layer wiring portions arranged so as to be spaced at a distance;
    a plurality of upper-layer wiring portions arranged so as to be spaced at a distance;
    an insulating layer provided between the plurality of lower-layer wiring portions and the plurality of upper-layer wiring portions;
    a plurality of contact units which electrically connects the plurality of lower-layer wiring portions and the plurality of upper-layer wiring portions so as to form a contact chain including the plurality of lower-layer wiring portions and the plurality of upper-layer wiring portions alternately connected in series; and
    a pair of electrode terminals, one of the electrode terminals being electrically connected to one end of the contact chain, the other of the electrode terminals being electrically connected to the other end of the contact chain;
    the inspection method comprising:
    acquiring an applied-voltage versus measured-current characteristic of the inspection pattern by applying a voltage to between the pair of electrode terminals and measuring a current flowing through the contact chain for a plurality of applied-voltages having different values; and
    judging presence or absence of a latent defect of the inspection pattern on the basis of the applied-voltage versus measured-current characteristic of the inspection pattern.

2. The inspection method according to claim 1, wherein a length of each of the plurality of lower-layer wiring portions, a length of each of the plurality of upper-layer wiring portions, and a position of each of the plurality of contact units are set in such a way that an interval between ones of the plurality of contact units adjacent to each other in a longitudinal direction of the lower-layer wiring portion or the upper-layer wiring portion is no shorter than 0.4 µm and no longer than 50 µm.

3. The inspection method according to claim 1, wherein a length of each of the plurality of lower-layer wiring portions, a length of each of the plurality of upper-layer wiring portions, and a position of each of the plurality of contact units are set in such a way that an interval between ones of the plurality of contact units adjacent to each other in a longitudinal direction of the lower-layer wiring portion or the upper-layer wiring portion is larger than 50 µm.

4. The inspection method according to claim 1, wherein each of the plurality of contact units includes one or more contact portions provided in one or more of contact holes formed in the insulating layer.

5. The inspection method according to claim 1, wherein an applied-voltage between the pair of electrode terminals of the inspection pattern is either a stepwise increasing voltage that increases by a predetermined voltage with passage of every predetermined time or a linearly increasing voltage.

6. The inspection method according to claim 1, wherein the judging is carried out on the basis of a gradient of a characteristic curve relating to the applied-voltage versus measured-current characteristic depicted in a rectangular coordinate system of the applied-voltage on an abscissa and of the measured-current on an ordinate, immediately before the inspection pattern is fused and broken.

7. The inspection method according to claim 6, wherein, in the judging, when the gradient of the characteristic curve immediately before the inspection pattern is fused and broken is not larger than a predetermined reference value, it is judged that no void is present in the contact portions of the contact units of the inspection pattern; while, otherwise, it is judged that a void is present in the contact portions of the contact units of the inspection pattern.

8. The inspection method according to claim 6, wherein, in the judging, when the gradient of the characteristic curve immediately before the inspection pattern is fused and broken is not smaller than a predetermined reference value, it is judged that no coverage defect is present in the contact portions of the contact units of the inspection pattern; while, otherwise, it is judged that a coverage defect is present in the contact portions of the contact units of the inspection pattern.

9. The inspection method according to claims 1, wherein the semiconductor device further includes at least one auxiliary pattern for evaluation of a degree of the latent defect detected using the inspection pattern, the auxiliary pattern having the same structure as the inspection pattern with the exception that at least one contact unit of the auxiliary pattern has a reduced size and/or includes a reduced number of contact portions when compared with the remaining contact units of the auxiliary pattern;

the inspection method further comprising:

acquiring an applied-voltage versus measured-current characteristic of the auxiliary pattern by applying a voltage to between a pair of electrode terminals of the auxiliary pattern and measuring a current flowing through the contact chain of the auxiliary pattern for a plurality of applied-voltages having different values; and evaluating a degree of the latent defect of the inspection pattern on the basis of both the applied-voltage versus measured-current characteristic of the inspection pattern when it is judged that the latent defect is present in the inspection pattern and the applied-voltage versus measured-current characteristic of the auxiliary pattern.

10. An inspection method of a semiconductor device, wherein the semiconductor device includes a multi-layer wiring structure, and an inspection pattern for detection of a latent defect of the multi-layer wiring structure; and wherein the inspection pattern includes:

a plurality of lower-layer wiring portions arranged so as to be spaced at a distance;

a plurality of upper-layer wiring portions arranged so as to be spaced at a distance;

an insulating layer provided between the plurality of lower-layer wiring portions and the plurality of upper-layer wiring portions;

a plurality of contact units which electrically connects the plurality of lower-layer wiring portions and the plurality of upper-layer wiring portions so as to form a contact chain including the plurality of lower-layer wiring portions and the plurality of upper-layer wiring portions alternately connected in series; and a pair of electrode terminals, one of the electrode terminals being electrically connected to one end of the contact chain, the other of the electrode terminals being electrically connected to the other end of the contact chain;

the inspection method comprising:

acquiring an elapsed-time versus measured-voltage characteristic of the inspection pattern by passing a predetermined current through between the pair of electrode terminals of the inspection pattern and measuring a time change in a voltage developed between the pair of electrode terminals; and judging presence or absence of a latent defect of the inspection pattern on the basis of the elapsed-time versus measured-voltage characteristic of the inspection pattern.

11. The inspection method according to claim 10, wherein a length of each of the plurality of lower-layer wiring portions, a length of each of the plurality of upper-layer wiring portions, and a position of each of the plurality of contact units are set in such a way that an interval between ones of the plurality of contact units adjacent to each other in a longitudinal direction of the lower-layer wiring portion or the upper-layer wiring portion is no shorter than 0.4 µm and no longer than 50 µm.

12. The inspection method according to claim 10, wherein a length of each of the plurality of lower-layer wiring portions, a length of each of the plurality of upper-layer wiring portions, and a position of each of the plurality of contact units are set in such a way that an interval between ones of the plurality of contact units adjacent to each other in a longitudinal direction of the lower-layer wiring portion or the upper-layer wiring portion is larger than 50 µm.

13. The inspection method according to claim 10, wherein each of the plurality of contact units includes one or more contact portions provided in one or more of contact holes formed in the insulating layer.

14. The inspection method according to claim 10, wherein the current passing through between the pair of electrode terminals of the inspection pattern has a current value determined in a range of 70% through 99% of a current value necessary for fusing and breaking an inspection pattern having the same structure.

15. The inspection method according to claim 10, wherein the judging is carried out on the basis of a variation value in a measured-voltage caused with passage of time.

16. The inspection method according to claim 15, wherein, in the judging, when a decrease in the variation value of the measured-voltage caused with passage of time is not larger than a predetermined value, it is judged that no void is present in the contact portions of the contact units of the inspection pattern; while, otherwise, it is judged that a void is present in the contact portions of the contact units of the inspection pattern.

17. The inspection method according to claim 15, wherein, in the judging, when an increase in the variation value of the measured-voltage caused with passage of time is not larger than a predetermined value, it is judged that no coverage defect is present in the contact portions of the contact units of the inspection pattern, while, otherwise, it is judged that a coverage defect is present in the contact portions of the contact units of the inspection pattern.

18. The inspection method according to claim 10, wherein the semiconductor device further includes at least one auxiliary pattern for evaluation of a degree of the latent defect detected using the inspection pattern, the auxiliary pattern having the same structure as the inspection pattern with the exception that at least one contact unit of the auxiliary pattern has a reduced size and/or includes a reduced number of contact portions when compared with the remaining contact units of the auxiliary pattern;

the inspection method further comprising:

acquiring an elapsed-time versus measured-voltage characteristic of the auxiliary pattern by passing a predetermined current through between the pair of electrode terminals of the auxiliary pattern and measuring a time change in a voltage developed between the pair of electrode terminals of the auxiliary pattern; and evaluating a degree of the latent defect of the inspection pattern on the basis of both the elapsed-time versus measured-voltage characteristic of the inspection pattern when it is judged that the latent defect is present in the inspection pattern and the elapsed-time versus measured-voltage characteristic of the auxiliary pattern.

19. An inspection system for a semiconductor device, wherein the semiconductor device includes a multi-layer wiring structure, and an inspection pattern for detection of a latent defect of the multi-layer wiring structure; and wherein the inspection pattern includes:

a plurality of lower-layer wiring portions arranged so as to be spaced at a distance;

a plurality of upper-layer wiring portions arranged so as to be spaced at a distance;

an insulating layer provided between the plurality of lower-layer wiring portions and the plurality of upper-layer wiring portions;

a plurality of contact units which electrically connects the plurality of lower-layer wiring portions and the plurality of upper-layer wiring portions so as to form a contact chain including the plurality of lower-layer wiring portions and the plurality of upper-layer wiring portions alternately connected in series; and a pair of electrode terminals, one of the electrode terminals being electrically connected to one end of the contact chain, the other of the electrode terminals being electrically connected to the other end of the contact chain;

the inspection system comprising:

a voltage-applying/current-measuring device which acquires an applied-voltage versus measured-current characteristic of the inspection pattern by applying a voltage to between the pair of electrode terminals and measuring a current flowing through the contact chain for a plurality of applied-voltages having different values; and a judging device which judges presence or absence of a latent defect of the inspection pattern on the basis of the applied-voltage versus measured-current characteristic of the inspection pattern.

20. An inspection system for a semiconductor device, wherein the semiconductor device includes a multi-layer wiring structure, and an inspection pattern for detection of a latent defect of the multi-layer wiring structure; and wherein the inspection pattern includes:

a plurality of lower-layer wiring portions arranged so as to be spaced at a distance;

a plurality of upper-layer wiring portions arranged so as to be spaced at a distance;

an insulating layer provided between the plurality of lower-layer wiring portions and the plurality of upper-layer wiring portions;

a plurality of contact units which electrically connects the plurality of lower-layer wiring portions and the plurality of upper-layer wiring portions so as to form a contact chain including the plurality of lower-layer wiring portions and the plurality of upper-layer wiring portions alternately connected in series; and a pair of electrode terminals, one of the electrode terminals being electrically connected to one end of the contact chain, the other of the electrode terminals being electrically connected to the other end of the contact chain;

the inspection system comprising:

a constant-current-feeding/voltage-measuring device which acquires an elapsed-time versus measured-voltage characteristic of the inspection pattern by passing a predetermined current through between the pair of electrode terminals of the inspection pattern and measuring a time change in a voltage developed between the pair of electrode terminals; and a judging device which judges presence or absence of a latent defect of the inspection pattern on the basis of the elapsed-time versus measured-voltage characteristic of the inspection pattern.

* * * * *